United States Patent

Irie et al.

[11] Patent Number: 5,808,910
[45] Date of Patent: Sep. 15, 1998

[54] ALIGNMENT METHOD

[75] Inventors: Nobuyuki Irie, Kawasaki; Shigeru Hirukawa, Kashiwa, both of Japan

[73] Assignee: Nikon Corporation, Tokyo, Japan

[21] Appl. No.: 704,363

[22] Filed: Aug. 29, 1996

Related U.S. Application Data

[63] Continuation of Ser. No. 223,848, Apr. 6, 1994, abandoned.

[30] Foreign Application Priority Data

Apr. 6, 1993 [JP] Japan ................................ 5-079415
Jun. 14, 1993 [JP] Japan ................................ 5-141913

[51] Int. Cl.$^6$ ............................................. G01B 11/26
[52] U.S. Cl. ....................... 364/559; 250/491.1; 356/399; 356/400; 356/401
[58] Field of Search ................... 250/491.1; 356/399, 356/400, 401; 364/559

[56] References Cited

U.S. PATENT DOCUMENTS

| | | | |
|---|---|---|---|
| 4,669,867 | 6/1987 | Uda et al. | 356/400 X |
| 4,699,515 | 10/1987 | Tanimoto et al. | 356/40 |
| 4,737,920 | 4/1988 | Ozawa | 356/401 X |
| 4,780,616 | 10/1988 | Nishi et al. | 250/548 |
| 4,780,617 | 10/1988 | Umatate et al. | 250/548 |
| 4,833,621 | 5/1989 | Umatate | 364/491 |
| 4,843,563 | 6/1989 | Takahashi et al. | 364/490 |
| 4,853,745 | 8/1989 | Kamiya et al. | 355/43 |
| 4,910,679 | 3/1990 | Takahashi et al. | 364/490 |
| 4,962,318 | 10/1990 | Nishi | 250/548 |
| 5,117,255 | 5/1992 | Shiraishi et al. | 355/53 |
| 5,118,953 | 6/1992 | Ota et al. | 250/548 |
| 5,151,750 | 9/1992 | Magome et al. | 356/401 |
| 5,194,893 | 3/1993 | Nishi | 355/53 |
| 5,243,195 | 9/1993 | Nishi | 356/401 X |
| 5,249,016 | 9/1993 | Tanaka | 355/53 |
| 5,498,501 | 3/1996 | Shimoda et al. | 250/491.1 X |
| 5,499,099 | 3/1996 | Sato et al. | 356/400 |
| 5,525,808 | 6/1996 | Irie et al. | 356/400 X |

*Primary Examiner*—Edward R. Cosimano
*Attorney, Agent, or Firm*—Shapiro and Shapiro

[57] ABSTRACT

A substrate has a plurality of areas, from which several specific areas are selected. The coordinate positions of the specific areas on a static coordinate system are measured and the coordinate positions of the specific areas on the static coordinate system are calculated by the statistic calculation. For the respective specific areas, the calculated coordinate positions are subtracted from the measured coordinate positions to obtain the respective nonlinear position errors of the specific areas. When there is a peculiar area where the nonlinear position error exceeds an allowed value, the coordinate position of at least one area around the peculiar area is measured to obtain the nonlinear position error thereof. Prior to calculating the coordinate positions of the areas on the substrate on the static coordinate system by the use of the coordinate positions of the specific areas, it is judged based on the nonlinear position errors of the peculiar area and the area around the peculiar area whether the coordinate position of the peculiar area is used.

17 Claims, 13 Drawing Sheets

ALIGNMENT METHOD

This is a continuation of application Ser. No. 08/223,848 filed Apr. 6, 1994, now abandoned.

BACKGROUND OF THE INVENTION

1. Field of the Invention

The present invention relates to an alignment method preferable for an exposure apparatus, a repair apparatus, an inspecting apparatus, etc., to be used in manufacturing, e.g., a semiconductor device, a liquid crystal display device, a thin film magnetic head.

2. Related Background Art

A step-and-repeat type projection exposure apparatus (stepper) is used in a manufacturing process of a semiconductor, etc. and especially in a photo-lithography process thereof. In the stepper, a pattern on a mask or a reticle (hereinafter referred to as the reticle) is transferred via a projection optical system to each of shot areas on a substrate (a semiconductor wafer, a glass plate, etc.) with a photosensitive material (photoresist) applied thereon in a step-and-repeat manner. The semiconductor device is formed by superimposing a plurality of circuit patterns on the wafer one over another. Therefore, when projecting and exposing the second circuit pattern on the wafer and thereafter, it is necessary to align the projected image of the reticle pattern and the circuit pattern on the wafer, i.e., the reticle and the wafer accurately. Presently, in the stepper, the enhanced-global-alignment (EGA) method is the mainstream, which is disclosed in U.S. Pat. Nos. 4,780,617 and 4,833,621.

The wafer has a plurality of shot areas each of which is formed with alignment marks. The shot areas are regularly arranged on the wafer based on arrangement coordinates preliminary set on the wafer. However, even though the wafer is shifted by the stepping based on the arrangement coordinate values (shot arrangement) upon the design of the plurality of shot areas on the wafer, the wafer is not necessarily aligned accurately due to the following factors:

(1) the residual rotation error θ of the wafer (2) the rectangular degree error w of the stage coordinate system (or shot arrangement)

(3) the linear expansion or contraction (scaling) Rx, Ry of the wafer (4) the offset (parallel movement) Ox, Oy of the wafer (center position)

Arrangement coordinates on the wafer based on these four error amounts (six parameters) can be expressed by the linear transformation. Then, the linear transformation model for transforming the coordinate system (x, y) on the wafer to the stage coordinate system (X, Y) with respect to the wafer with the plurality of shot areas arranged regularly thereon can be expressed by the use of six transformation parameters a to f as follows:

$$\begin{pmatrix} X \\ Y \end{pmatrix} = \begin{pmatrix} a & b \\ c & d \end{pmatrix} \begin{pmatrix} x \\ y \end{pmatrix} + \begin{pmatrix} e \\ f \end{pmatrix} \quad (1)$$

The six transformation parameters a to f in this equation can be obtained by, e.g., the least squares approximation method. Namely, among the plurality of shot areas (hereinafter called exposure shots) on the wafer, n exposure shots are selected and each of the n exposure shots (hereinafter called sample shots) is positioned (alignment) in the predetermined positions in accordance with the arrangement coordinates upon the design (x1, y1), (x2, y2), . . . , (xn, yn). And, the respective coordinate values (XM1, YM1), (XM2, YM2), . . . , (XMn, YMn) of the n sample shots on the stage coordinate system (X, Y) are measured.

Next, the difference ($\Delta$x, $\Delta$y) between the above measured value (XMi, YMi) and the arrangement coordinates upon the calculation (Xi, Yi) obtained by substituting the arrangement coordinates upon the design (xi, yi) (i=1, . . . , n) of the respective sample shots in the above linear transformation model (equation (1)) is considered as the alignment error. The alignment error $\Delta$x is expressed by $\Sigma(Xi-XMi)^2$ and the alignment error $\Delta$y is expressed by $\Sigma(Yi-YMi)^2$ Further, the alignment errors $\Delta$x and $\Delta$y are partially differentiated with the six transformation parameters sequentially to obtain six expressions and six equations are set up such that the values of the six expressions become zero. Then, when the six simultaneous equations are solved, the six transformation parameters can be obtained. Thereafter, arrangement coordinates of the entire exposure shots on the wafer are calculated by using the linear transformation model (equation (1)) including the obtained transformation parameters a to f. As a result, when the wafer is positioned in accordance with the calculated arrangement coordinates, the alignment of the entire exposure shots can be performed accurately.

Also, another method has been proposed in U.S. Pat. Ser. No. 011,697 filed Feb. 1, 1993 (abandoned), superseded by co-pending Ser. No. 08/538,467 filed Oct. 3, 1995, now U.S. Pat. No. 5,561,606 issued Oct. 1, 1996, wherein when the preferable approximation accuracy cannot be obtained by the above linear equation (equation (1)), the equation of the second degree or much higher degree is used. As the linear approximation is performed in the above-mentioned EGA method, there is an inconvenience that the alignment accuracy is lowered when there is nonlinear distortion on the wafer. Then, a so-called weighting EGA method has been proposed in the U.S. Pat. No. 005,146 filed Jan. 15, 1993 (abandoned), superseded by co-pending Ser. No. 08/360,028 filed Dec. 20, 1994, now U.S. Pat. No. 5,525,808 issued Jun. 11, 1996. In the weighting EGA method, by using Wi corresponding to the distances between an exposure shot and the n sample shots, the alignment errors $\Delta$x and $\Delta$y are expressed by $\Sigma Wi(Xi-XMi)^2$ and $\Sigma Wi(Yi-YMi)^2$ respectively. Then, the transformation parameters a to f are obtained by the least squares method.

In the above-mentioned alignment methods, there is a case that the arrangement coordinates of the sample shots are deviated largely from the regularity of the shot arrangement on the wafer owing to the positioning error of the wafer at the time of the exposure for the previous layer, the partial distortion of the wafer, the damaged or scratched alignment marks, or the like. Such a sample shot is called "peculiar shot". The existence of only one such abnormal shot causes the reduction of the alignment accuracy. Then, the EGA method is applied to a wafer in a lot to calculate arrangement coordinates of all exposure shots and arrangement coordinates of all the exposure shots are measured by an alignment sensor. Then, in all the wafers of the lot, exposure shots where the difference between the calculated arrangement coordinates and the measured arrangement coordinates is equal to or more than a predetermined value are regarded as peculiar shots and are not selected, which method has been proposed in the aforesaid U.S. Pat. Ser. No. 011,697 filed Feb. 1, 1993 (abandoned), superseded by co-pending Ser. No. 08/361,158 filed Dec. 21, 1994, now U.S. Pat. No. 5,561,606 issued Oct. 1, 1996.

In the EGA method, when the peculiar shot is caused by the measurement error, the measurement result needs to be excluded. On the other hand, when the peculiar shot is caused by the partial distortion, the exposure shots located in the area having the partial distortion need to be subjected to the alignment different from that of the other exposure shots. However, in the above methods, it is considered indiscriminately that all the peculiar shots are caused by the measurement errors and the measurement results are not used, whereby the desired alignment accuracy cannot be obtained. This problem occurs in the weighting EGA method also. Further, in the weighting EGA method, when the measurement error of the coordinate positions of the sample shot is large, the alignment accuracy of the exposure shots around the sample shot is affected by the measurement error largely. As above, when the sample shot has the nonlinear arrangement error in the conventional methods, it cannot be judged whether the nonlinear arrangement error is caused by the distortion of the wafer or the measurement error (the damage or scratch of the alignment marks), which reduces the alignment accuracy considerably.

SUMMARY OF THE INVENTION

It is an object of the present invention to provide an alignment method of aligning each of shot areas on a substrate and a predetermined position with high accuracy and at high speed even though a sample shot has a nonlinear arrangement error.

In the present invention, prior to aligning each of a plurality of areas to be processed on a substrate and a predetermined position in a static coordinate system for defining a moving position of the substrate, at least three areas of the areas to be processed are selected as sample areas and coordinate positions of the sample shots on the static coordinate system are measured. Then, the measured coordinate positions are subjected to statistic calculation to obtain coordinate positions of the plurality of areas on the substrate on the static coordinate system. Thereafter, in accordance with the calculated coordinate positions, the moving position of the substrate is controlled to align each of the plurality of areas to be processed and the predetermined position.

The first alignment method comprises the first step of measuring the coordinate positions of the plurality of sample areas on the static coordinate system, the second step of obtaining nonlinear error amounts of the coordinate positions of the respective sample areas based on the measured coordinate positions thereof, the third step of determining as a peculiar area, the area of the sample areas where the nonlinear error amount exceeds a predetermined allowed value and measuring coordinate positions of areas around the peculiar area and the fourth step of obtaining nonlinear error amounts of the areas around the peculiar area based on the coordinate positions measured in the steps 1 and 3. When the nonlinear error amounts of the areas around the peculiar area and the nonlinear error amount of the peculiar area have the same trend, coordinate positions of the peculiar area and the areas around the peculiar area on the static coordinate system are calculated by subjecting the coordinate position of the peculiar area measured in the step 1 and the plurality of coordinate positions measured in the step 3 to the statistic calculation. On the other hand, when the nonlinear error amount of the peculiar area and the nonlinear error amounts of the areas around the peculiar area have different trends, the plurality of coordinate positions measured in the steps 1 and 3 excluding the coordinate position of the peculiar area measured in the step 1 are subjected to the statistic calculation, thereby to calculate arrangement coordinates of the plurality of areas to be processed on the substrate.

Namely, according to the first alignment method, when there is the peculiar area having the large nonlinear error amount among the plurality of sample areas on the substrate, the coordinates of the areas around the peculiar area on the static coordinate system are measured to obtain the nonlinear error amounts thereof. And, when the nonlinear error amount of the peculiar area and the nonlinear error amounts of the areas around the peculiar area have the same trend, it is deemed that the nonlinear error amount of the peculiar area is caused by a partial nonlinear distortion of the substrate and the alignment of the areas (the peculiar area and the areas around the peculiar area) within the partially distorted region is performed based on the measurement results (coordinates). On the other hand, when the nonlinear error amount of the peculiar area and the nonlinear error amounts of the areas around the peculiar area have the different trends, it is deemed that the nonlinear error amount of the peculiar area is caused by the measurement error and the measurement result of the peculiar area is excluded and the alignment is performed based on the measurement results of the others. The alignment of the peculiar area is performed by the die-by-die method or based on the measurement results of the sample areas other than the peculiar area.

The second alignment method comprises the first step of selecting at least three sample areas and measuring coordinate positions of the sample areas on a static coordinate system, the second step of performing statistic calculation to the measured coordinate positions to calculate coordinate positions of the respective sample areas and calculating the differences between the respective calculated coordinate positions of the sample areas and the coordinate positions measured in the step 1, i.e., nonlinear error amounts of the sample areas, the third step of determining as a peculiar area, the sample area of the sample areas where the nonlinear error amount exceeds an allowed value, determining as an alternative area, at least one area around the peculiar area and measuring a coordinate position of the alternative area, the fourth step of calculating a coordinate position of the alternative area by performing the statistic calculation to the plurality of coordinate positions measured in the steps 1 and 3 and obtaining the difference between the calculated coordinate position of the alternative area and the measured coordinate position in the third step, i.e., nonlinear error amount of the alternative area and the fifth step of comparing the nonlinear error amount of the peculiar area and that of the alternative area and determining the coordinate position to be used to calculate coordinate positions of the plurality of area to be processed on the substrate. Based on the coordinate position determined in the fifth step and the coordinate positions of the sample areas measured in the first step excluding the coordinate position of the peculiar area, arrangement coordinates of the plurality of areas to be processed on the substrate on the static coordinate system are calculated.

The present invention is aiming at the point that the arrangement changes of the areas to be processed due to the partial distortion of the substrate are continuous to a certain degree but the measurement error of a sample area is peculiar to its sample area and has no relation to the areas around the sample area, i.e., the arrangement changes are discontinuous (random). Then, by using the fact that the change of the distortion of the areas to be processed on the substrate is different between in the case of nonlinear distortion and in the case of the measurement error, the present invention specifies as to whether the cause of the arrangement changes of the areas to be processed is due to the nonlinear distortion or the measurement error. That is, when the nonlinear error amount of the peculiar area and the nonlinear error amounts of the areas (alternative area) around the peculiar area have the same trend, i.e., the nonlinear distortion of the substrate is due to the occurrence of the nonlinear error, the measurement results of the peculiar area and the areas (alternative area) around the peculiar area are used together with the measurement results of the other sample areas to perform the alignment. On the other hand, when the nonlinear error amount of the peculiar area and the nonlinear error amounts of the areas (alternative area) around the peculiar area have different trends, i.e., the occurrence of the nonlinear error is due to the measurement error of a sample area, the measurement result of the peculiar area is excluded and the alignment is performed by the use of the left measurement results.

According to the present invention as above, regarding the peculiar area having the especially large nonlinear error amount, it is judged as to whether the nonlinear error amount is caused by the measurement error due to the damaged or scratched alignment marks or by the partial distortion. When it is caused by the measurement error, the measurement result of the peculiar area is excluded to perform the alignment, while when it is caused by the partial distortion, the measurement results of the peculiar area and the areas (alternative area) around the peculiar area and the measurement results of the left sample areas are used to perform the alignment. As a result, even though there is the peculiar shot among the substrate, the alignment can be performed on the entire surface of the substrate with high accuracy.

DETAILED DESCRIPTION OF THE PREFERRED EMBODIMENTS

Figure 2:
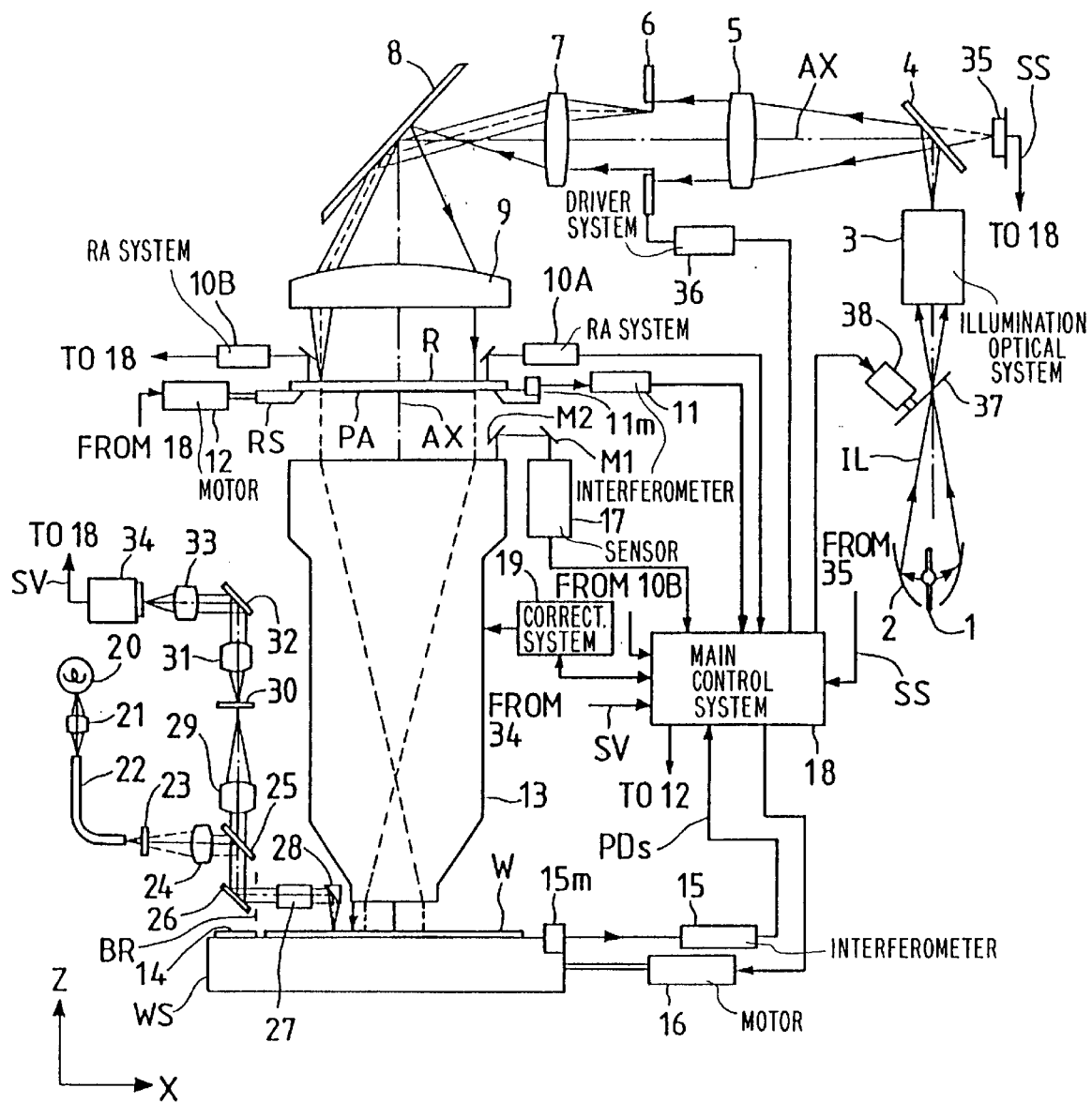
FIG. 2 schematically shows the structure of a projection exposure according to the present invention.

FIG. 2 shows a projection exposure apparatus preferable for applying an alignment method of the present invention. In FIG. 2, illumination light IL emitted from an extra-high pressure mercury emission lamp 1 is reflected by an elliptical mirror 2 and condensed at a second focal point. Thereafter, the illumination light IL enters an illumination optical system 3 including a collimator lens, an interference filter (wavelength selection device), an optical integrator (fly eye lens), an aperture stop (σ stop), or the like. The fly eye lens (not shown) is disposed in a plane perpendicular to an optical axis AX such that the focal surface of the fly eye lens on the side of a reticle R coincides with a Fourier transform surface with respect to a pattern formed surface of the reticle R. Also, in the vicinity of the second focal point of the elliptical mirror 2 is disposed a shutter (rotary shutter with four blades) 37 for opening or closing the optical light-path of the illumination light IL by a motor 38. In addition to the emission lines from the extra-high pressure mercury lamp, the illumination light IL may be a laser light such as an excimer laser (KrF excimer laser, ArF excimer laser, etc.) or a higher hermonic such as a metal vapor laser, a YAG laser.

After the illumination light IL (i-lines, etc.) of the wavelength region for exposing a resist layer is emitted from the illumination optical system 3, approximately all the illumination light IL is reflected by a beam splitter 4 and thereafter reaches a mirror 8 via a first relay lens 5, a variable field stop (reticle blind) 6 and a second relay lens 7. Further, the illumination light IL reflected by the mirror 8 illuminates a pattern area PA of the reticle R with uniform illuminance via a condenser lens 9. The reticle blind 6 is disposed in a plane which has a conjugate relationship (image forming relationship) with the pattern formed surface of the reticle R. Accordingly, the illumination field of the reticle R can be changed at will by changing the largeness and the shape of the opening portion of the reticle blind 6 by separately driving a plurality of movable blades of the reticle blind 6 by means of a driving system 36.

The reticle R of FIG. 2 is provided with alignment marks at approximately center points of four sides of the rectangular pattern area PA surrounded by a light-shielding zone with a predetermined width. When the alignment marks (hereinafter called simply the reticle marks) on the reticle R are projected to the resist layer of a wafer W via a projection optical system 13, latent images of the reticle marks are formed on the resist layer. In this embodiment, those reticle marks are also used for aligning each of the shot areas of the wafer W and the reticle R. Two opposite reticle marks on the reticle are multi-marks each of which consists of, e.g., five diffraction grating marks arranged in the X direction at regular intervals. The diffraction grating mark consists of seven dot marks arranged in the Y direction. The other two opposite reticle marks are formed such that those multi-marks are rotated at 90°. These reticle marks are formed by light-shielding portions such as chrome in transparent windows provided in the light-shielding zone of the reticle R. Further, in the vicinity of the outer periphery of the reticle R is formed two cross marks with light-shielding property so as to be opposite to each other. These cross marks are used for alignment (with respect to the optical axis of the projection optical system 13) of the reticle R.

The reticle R is disposed on a reticle stage RS which can be slightly moved in the direction of the optical axis AX of the projection optical system 13, inclined with respect to the plane perpendicular to the optical axis AX and moved two-dimensionally and slightly rotated in the plane perpendicular to the optical axis AX by a motor 12. A movable mirror 11*m* is fixed to an end of the reticle stage RS so as to reflect a laser beam from a laser interferometric measuring machine (laser interferometer) 11. The two-dimensional position of the reticle stage RS is constantly detected by the laser interferometer 11 with the resolving power of, e.g., 0.01 μm. Also, two sets of reticle alignment systems (RA systems) 10A and 10B are disposed over the reticle R to detect the two cross marks formed in the vicinity of the periphery of the reticle R. By shifting the reticle stage RS slightly in the X, Y and θ directions based on measurement signals from the RA systems 10A and 10B, the reticle R is positioned such that the center point of the pattern area PA coincides with the optical axis of the projection optical axis 13.

The illumination light IL passed through the pattern area PA of the reticle R enters the projection optical system 13 which is telecentric on both sides. The projection optical system 13 projects the circuit pattern of the reticle R at e.g., ⅕ magnification to the surface of the resist layer on the wafer W which coincides with the optimum image forming surface of the projection optical system 13.

The wafer W is attached vacuously to a slightly rotatable wafer holder (not shown) and supported by the wafer stage WS via the wafer holder. The wafer stage WS is movable two-dimensionally by a motor 16 in a step-and-repeat manner. When the pattern of the reticle R has been transferred and exposed on a shot area of the wafer W, the wafer stage WS is shifted to set the following shot area on the wafer W. A movable mirror 15*m* is fixed to an end of the wafer stage WS to reflect a laser beam from a laser interferometer 15. The two-dimensional position of the wafer stage WS is constantly detected by the laser interferometer 15 with the resolving power of, e.g., 0.01 μm. Namely, a static coordinate system (rectangular coordinate system) XY for defining movement of the wafer stage WS in a plane perpendicular to the optical axis AX is determined by the laser interferometer 15.

Also, a reference member (glass base plate) 14 is provided on the wafer stage WS to measure base lines. The height of the reference member 14 is the same as the wafer W. The reference member 14 is provided with a slit pattern consisting of five sets of L-shaped patterns of a light transmittance type and two sets of reference patterns of a light reflective type (duty ratio is 1:1). One of the two sets of reference patterns consists of a first mark and a second mark. The first mark has three diffraction grating marks arranged in the X direction. Each of the diffraction grating marks is formed of seven dot marks arranged in the Y direction. The second mark has twelve bar marks extending in the Y direction which are arranged in the X direction. The other one of the two sets of reference patterns are formed by rotating the above reference pattern at 90°.

An illumination light (exposure light) propagated under the reference member 14 by an optical fiber and a mirror, etc. illuminates the slit pattern of the reference member 14 from under (in the wafer stage). The illumination light transmitted through the slit pattern of the reference member 14 passes the projection optical system 13 and forms a projected image of the slit pattern on the rear surface (the pattern formed surface) of the reticle R. Further, the illumination light transmitted through one of the four reticle patterns on the reticle R reaches the beam splitter 4 via the condenser lens 9 and the relay lenses 7 and 5. Then, the illumination light transmitted through the beam splitter 4 is incident on a photoelectric detecting device 35 whose light receiving surface is disposed in a plane approximately conjugate to a pupil surface (a Fourier transform surface with respect to the pattern formed surface of the reticle R) of the projection optical system 13. The photoelectric detecting device 35 outputs a photoelectric signal SS in accordance with the intensity of the illumination light to a main control system 18. Hereinafter, the optical fiber, the mirror, the reference member 14 and the photoelectric detecting device 35 are called ISS (Imaging Slit Sensor) system as a whole. The detailed structure of the ISS system is disclosed in, e.g., U.S. Pat. Nos. 4,780,616 and 4,853,745.

Also, an imaging optical characteristics correcting section 19 is provided to adjust the imaging optical characteristics of the projection optical system 13. The imaging optical characteristics correcting section 19 corrects the imaging optical characteristics of the projection optical system 13 such as magnification, distortion, field curvature or the like by separately driving some lens elements constituting the projection optical system 13, especially a plurality of lens elements closer to the reticle R. The detailed structure of the imaging characteristics correcting section 19 is disclosed in, e.g., U.S. Pat. No. 5,117,225.

An off-axis type alignment sensor (hereinafter called Field Image Alignment (FIA) system) is provided on a side of the projection optical system 13. In the FIA system, light of a wide band region emitted from a halogen lamp 20 is led via a condenser lens 21, an optical fiber 22 to an interference filter 23, wherein lights of the wavelength region exposing the resist layer and the infrared region are cut. The light transmitted through the interference filter 23 is incident on a telecentric objective lens 27 via a lens system 24, a beam splitter 25, a mirror 26 and a field stop BR. The light emitted from the objective lens 27 is reflected by a prism (or a mirror) 28 secured to a lower portion of the lens tube of the projection optical system 13 so as not to shield the illumination field of the projection optical system 13 and illuminates the wafer W approximately perpendicularly.

The light from the objective lens 27 illuminates a portion on the wafer W including an alignment mark (hereinafter simply called the wafer mark). The light reflected from the portion is led via the prism 28, the objective lens 27, the field stop BR, the mirror 26, the beam splitter 25 and a lens system 29 to an index plate 30. The index plate 30 is disposed in a plane conjugate to the wafer W with respect to the objective lens 27 and the lens system 29. The image of the wafer mark is formed in a transparent window of the index plate 30. As index marks, the index plate 30 is formed with two linear marks which extend in the Y direction and are disposed so as to be apart from each other at a predetermined distance in the X direction. The light passed through the index plate 30 is led to an image pick-up device (CCD camera or the like) 34 via a first relay lens system 31, a mirror 32 and a second relay lens system 33. Then, the image of the wafer mark and the image of the index marks are formed on a light receiving surface of the image pick-up device 34. An image pick-up signal SV from the image pick-up device 34 is supplied to the main control system 18, in which the position (coordinate value) of the wafer mark in the X direction is calculated. The structure of the FIA system is disclosed in, e.g., U.S. Pat. No. 4,962,318. Although not shown in FIG. 2, one more FIA system for detecting the position of a wafer mark in the Y direction is provided.

Further, a TTL (Through the Lens) type alignment sensor 17 is provided on a side of the projection optical system 13. An illumination light, e.g., a He-Ne laser beam with the wavelength of 633 nm is directed to a wafer mark of the wafer W via mirrors M1, M2 and the projection optical system 13. The reflected light from the wafer mark returns to the alignment sensor 17 via the projection optical system 13 and the mirrors M2 and M1. The alignment sensor 17 obtains the position of the wafer mark based on a signal obtained by converting the reflected light photoelectrically.

Figure 3:
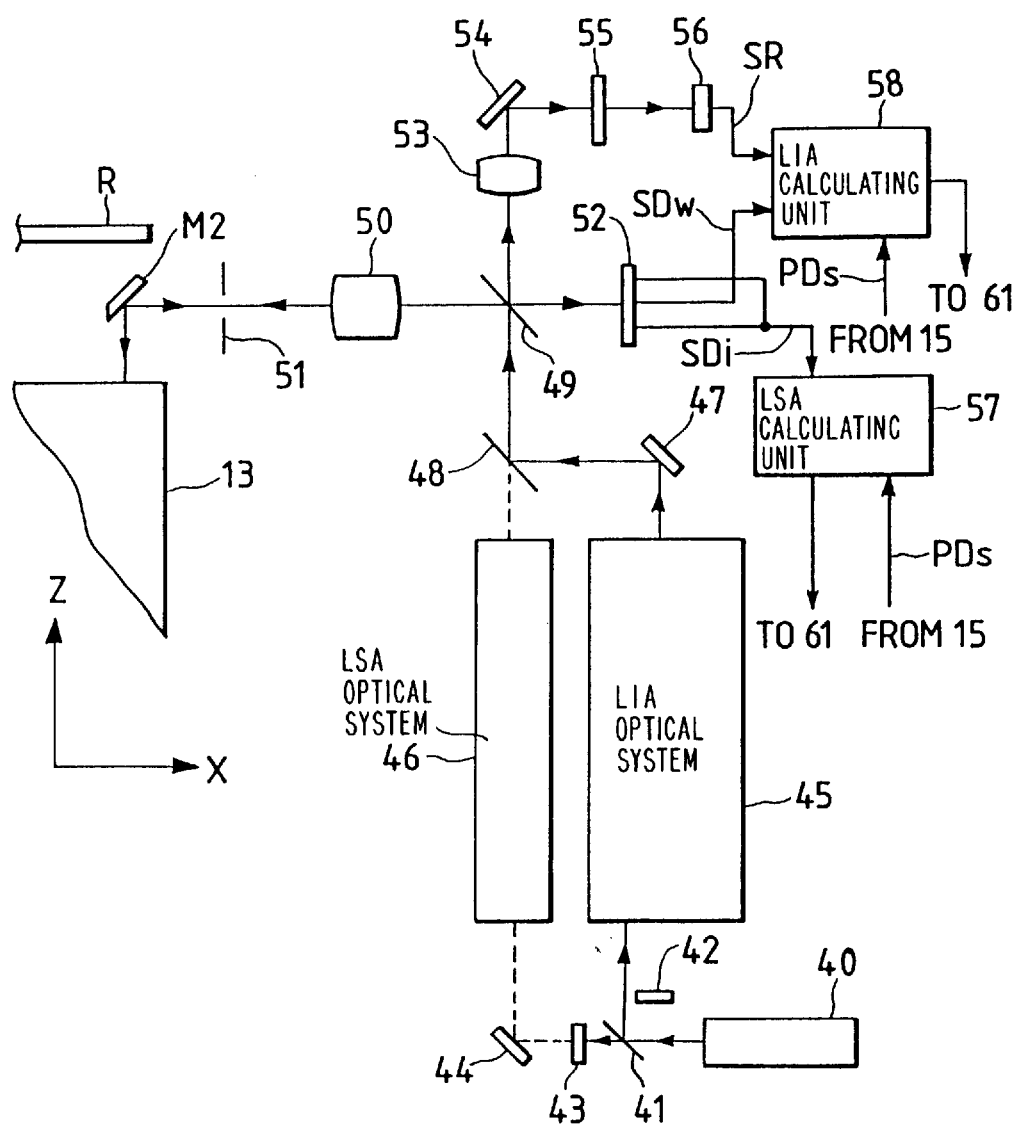
FIG. 3 schematically shows the structure of the TTL type alignment sensor in FIG. 2.

FIG. 3 shows the structure of the alignment sensor 17 in FIG. 2 in detail. The alignment sensor 17 is constituted of a double beam interference type alignment system (hereinafter called Laser Interferomatric Alignment (LIA) system) disclosed in, e.g., U.S. Pat. No. 5,118,953, and a diffraction type alignment system (hereinafter called Laser Step Alignment (LSA) system) disclosed in, e.g., U.S. Pat. No. 4,699,515, wherein the same optical members are shared maximumly. Its structure will be simply described below, but its detailed structure is disclosed in U.S. Pat. No. 5,151,750.

In FIG. 3, a laser beam emitted from a He-Ne laser light source 40 is divided by a beam splitter 41. The laser beam reflected by the beam splitter 41 enters a first beam shaping optical system (LIA optical system) 45 via a shutter 42. On the other hand, the laser beam transmitted through the beam splitter 41 enters a second beam shaping optical system (LSA optical system) 46 via a shutter 43 and a mirror 44. Consequently, either the LIA system or the LSA system can be used switchably by separately driving the shutters 42 and 43.

The LIA optical system 45 includes two sets of acoustooptic modulators (AOM) and emits two laser beams with a predetermined frequency difference Δf given approximately symmetrically with respect to the optical axis of the LIA optical system 45. The two laser beams emitted from the LIA optical system 45 reaches a beam splitter 49 via a mirror 47 and a beam splitter 48. The two laser beams transmitted through the beam splitter 49 are incident on a referential diffraction grating 55 (via lens 53 and mirror 54) from two different directions at a predetermined crossing angle to form an image (intersect). A photoelectric detecting device 56 receives the interference light of the diffraction lights emanated from the referential diffraction grating 55 approximately in the same direction and outputs a sine-wave-like photoelectric signal SR in accordance with the intensity of the diffraction lights to the main control system 18 (LIA calculating unit in FIG. 4).

Figure 4:
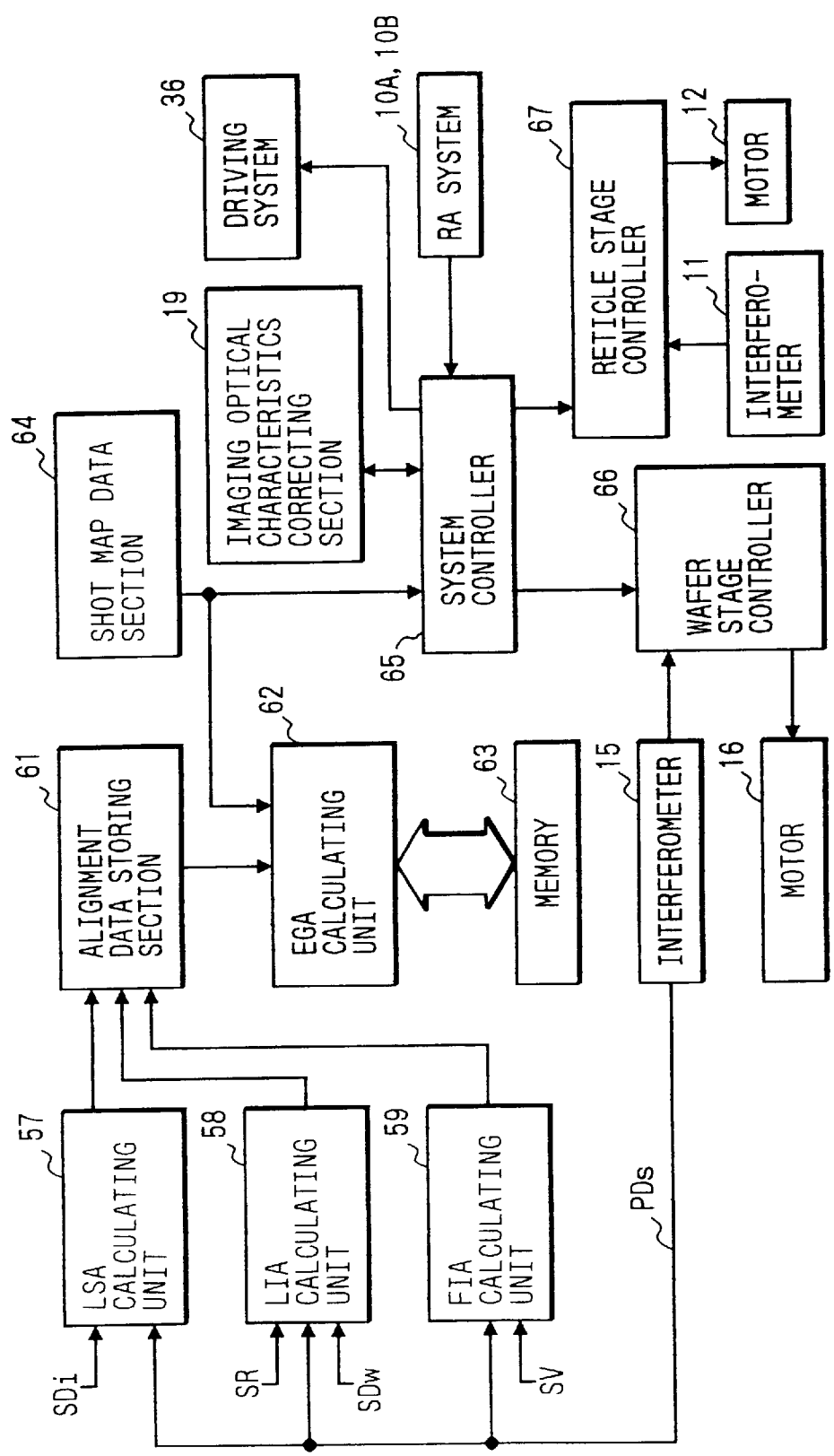
FIG. 4 is a block diagram showing the control system of the apparatus in FIG. 2.

On the other hand, the two laser beams reflected by the beam splitter 49 are once intersected in a field stop 51 by an objective lens 50 and thereafter enter the projection optical system 13 via the mirror M2 (the mirror M1 is not shown in FIG. 3). The two laser beams entering the projection optical system 13 are once condensed like a spot approximately symmetrically with respect to the optical axis AX on the pupil surface of the projection optical system 13. Thereafter, the two laser beams become each parallel luminous flux inclined at the same angle with respect to the optical axis AX in the pitch direction (Y direction) of a wafer mark on the wafer W and are incident on the wafer mark from the two different directions at a predetermined crossing angle. As a result, the one-dimensional interference pattern shifting at a speed corresponding to the frequency difference Δf is formed on the wafer mark. The two diffraction lights being generated in the same direction from the wafer mark which are ±primary diffraction lights (interference light) being generated in the direction of the optical axis here are incident on a photoelectric detecting device 52 via the projection optical system 13, the objective lens 50 and the like. The photoelectric detecting device 52 outputs a sine-wave-like photoelectric signal SDw corresponding to the periods of the change of the light and darkness of the interference pattern to a LIA calculating unit 58 (FIG. 4). The LIA calculating unit 58 calculates the deviation of the position of the wafer mark from the phase difference of the waveforms of the two photoelectric signals SR and SDw. Also, by using a position signal PDs from the laser interferometer 15, the LIA calculating unit 58 obtains the coordinate position of the wafer stage WS when the deviation of the position of the wafer mark becomes zero. The obtained data is output to an alignment data storing section 61 (FIG. 4).

The LSA optical system 46 includes a beam expander, a cylindrical lens and the like. The laser beam emitted from the LSA optical system 46 enters the objective lens 50 via the beam splitters 48 and 49. The laser beam emitted from the objective lens 50 is converged in the field stop 51 like a slit and thereafter enters the projection optical system 13 via the mirror M2. Then, after the laser beam passes approximately the center of the pupil surface of the projection optical system 13, it is expanded in the X direction in the projection field of the projection optical system 13 and illuminates the wafer W as the elongated strip-like spot light so as to be directed to the optical axis AX.

Further, when moving the spot light and the wafer mark (diffraction grating mark) on the wafer relatively to each other, the light reflected from the wafer mark is received by the photoelectric detecting device 52 via the objective lens 50. The photoelectric detecting device 52 only converts ±primary to ±third diffraction lights among the light from the wafer mark and outputs a photoelectric signal SDi corresponding to the intensity of those diffraction lights to the main control system 18 (LSA calculating unit 57 in FIG. 4). A position signal PDs from the laser interferometer 15 is also input in the LSA calculating unit 57, which then samples the photoelectric signal SDi in synchronism with an up-and-down pulse generated for the moving amount of the wafer stage WS per unit. Further, the LSA calculating unit 57 converts the respective sampling values into digital values and stores the digital values in a memory in the order of addresses. Thereafter, the LSA calculating unit 57 calculates the position of the wafer mark in the Y direction by a predetermined calculation process and outputs the calculated data to the alignment data storing section 61 (FIG. 4).

Next, the control system of the projection exposure apparatus in FIG. 2 will be described with reference to FIG. 4. FIG. 4 is a block diagram showing the control system of this embodiment. The main control system 18 in FIG. 2 is constituted of the LSA calculating unit 57, the LIA calculating unit 58, the FIA calculating unit 59, the alignment data storing section 61, the EGA calculating unit 62, a memory 63, a shot map data section 64, a system controller 65, a wafer stage controller 66 and a reticle stage controller 67.

In FIG. 4, the LSA calculating unit 57, the LIA calculating unit 58 and the FIA calculating unit 59 obtain the positions of wafer marks (coordinate positions on the rectangular coordinate system XY defined by the interferometer 15)

based on photoelectric signals from the alignment sensors and supply the coordinate positions to the alignment data storing section 61. The position data stored in the storing section 61 are supplied to the EGA calculating unit 62 as required. The shot map data storing section 64 stores the arrangement coordinate value upon the design for each shot area on the wafer W. These position data are also supplied to the EGA calculating unit 62. The EGA calculating unit 62 calculates six transformation parameters a to f of the model function (equation (1)) for calculating coordinate positions of all the shot areas on the wafer W based on the respective coordinate values from the storing sections 61 and 64 by the use of the statistic technique (e.g., method of least squares). The obtained transformation parameters a to f are sent to the memory 63.

Further, the EGA calculating unit 62 calculates respective coordinate positions of all the shot areas on the wafer W by the use of the model function (equation (1)) including the previously obtained transformation parameters a to f. The calculated coordination positions are sent to the system controller 65. The system controller 65 determines target positions by adding the coordinate positions from the EGA calculating unit 62 and the base line amount and supplies the determined target positions to the stage controller 66. The stage controller 66 drives the wafer stage WS by the motor 16 such that the measured value of the laser interferometer 15 coincides with the target position, whereby each shot area on the wafer W is positioned on a predetermined exposure position (projection position of the reticle pattern and usually the position of the optical axis of the projection optical system 13) in the rectangular coordinate system XY. The base line amount which is the distance between the detecting center of the FIA system, the LIA system, or the LSA system and the optical axis AX of the projection optical system 13 is measured in advance by means of the ISS system. The system controller 65 gives instructions to the stage controller 67 in accordance with the measured results of the two sets of RA systems 10A, 10B or the ISS system. While monitoring the measured value of the laser interferometer 11, the stage controller 67 drives the reticle stage RS by the motor 12 to effect the alignment of the reticle R.

Figure 5A:
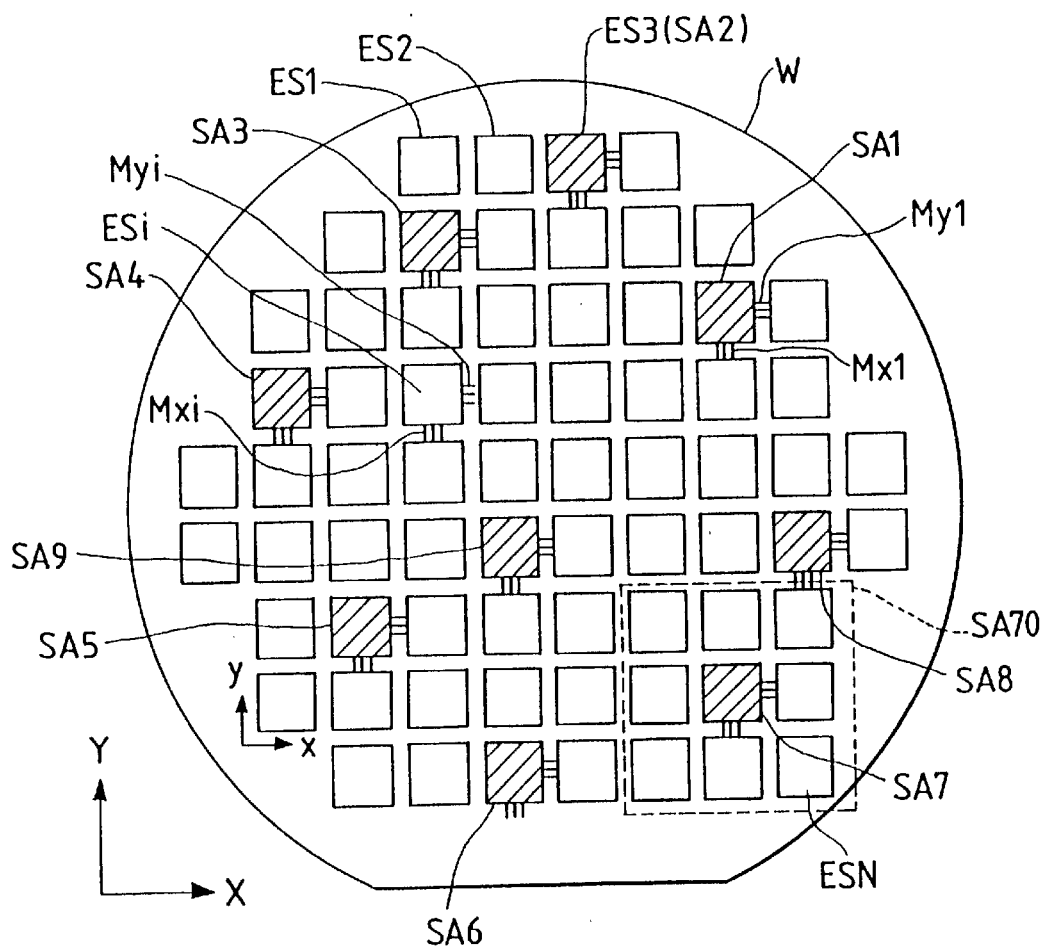
FIG. 5A shows the arrangement of the exposure shots of a wafer to be used the first embodiment.

Next, an exposure sequence of the alignment method of this embodiment will be described with reference to FIG. 1. First, the main control system 18 loads the wafer W to be exposed onto the wafer stage WS. FIG. 5A shows the arrangement of shots on the wafer W and N exposure shots ES1 to ESN are formed on the wafer W regularly. Each exposure shot has a chip pattern formed by the exposure processes for the previous layers. Also, the exposure shots are partitioned with street lines extending in the X, Y directions and each provided with two sets of wafer marks Mxi and Myi. However, in FIG. 5A, only several exposure shots (e.g., ES3) are provided with wafer marks. The wafer mark Mxi of the exposure shot ESi is formed on the middle portion of a street line extending in the X direction while the wafer mark Myi thereof is formed on the middle portion of a street line extending in the Y direction. The wafer mark Mxi has three bar marks which extends in the Y direction and are arranged in the X direction at predetermined intervals. The wafer mark Myi is formed such that the wafer mark Mxi is rotated at 90°.

In the step 101 in FIG. 1, the system controller 65 detects wafer marks of nine exposure shots (hereinafter called sample shots) selected from the N exposure shots on the wafer W by using the two sets of FIA systems. The FIA calculating unit 59 obtains the coordinate position for each wafer mark by processing the waveform of the image pick-up signal SV from the FIA system.

Figure 6:
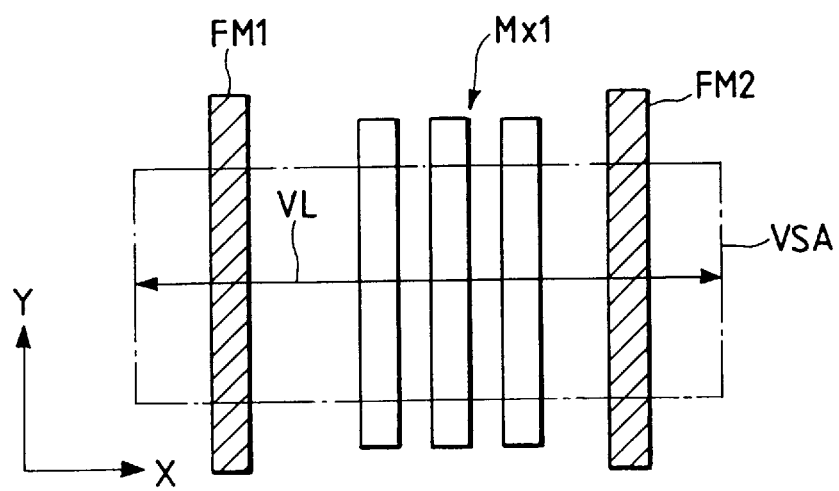
FIG. 6 is an explanatory diagram for explaining the method of detecting an alignment mark by the FIA system.

FIG. 6 shows the condition of the wafer mark Mx1 detected by the X-FIA system in FIG. 2. The image pick-up device 34 supplies its image pick-up signal SV to the FIA calculating unit 59. As shown in FIG. 6, in the image pick-up field VSA of the image pick-up device 34, there are the wafer mark Mx1 and the index marks FM1 and FM2 on the index plate 30 sandwiching the wafer mark Mx1 therebetween. The image pick-up device 34 scans the images of the wafer mark Mx1 and the index marks FM1 and FM2 electrically along a horizontal scanning line VL. At this time, it is disadvantageous to use one scanning line in terms of SN ratio. Therefore, a plurality of horizontal scanning lines are provided in the image pick-up field VS and levels of image pick-up signals obtained from the respective horizontal scanning lines are added and averaged for respective pixels in the horizontal direction. After the FIA calculating unit 59 has subjected these image pick-up signals to waveform processing and has detected the deviation amount between the wafer mark Mx1 and the index marks FM1, FM2, it uses the position signal PDs from the interferometer 15 to obtain the coordinate position of the wafer mark Mx1 in the X direction when the deviation amount becomes zero. Also, the system controller 65 detects the wafer mark My1 of the sample shot SA1 by the use of the Y-FIA system. Then, the FIA calculating unit 59 subjects the image pick-up signals to waveform processing to obtain the coordinate position of the wafer mark My1 in the Y direction. The coordinate positions in the X and Y directions with respect to the respective sample shots SA2 to SA9 are obtained in the similar manner to the above-mentioned operation. These coordinate positions are stored in the memory 61.

Figure 5B:
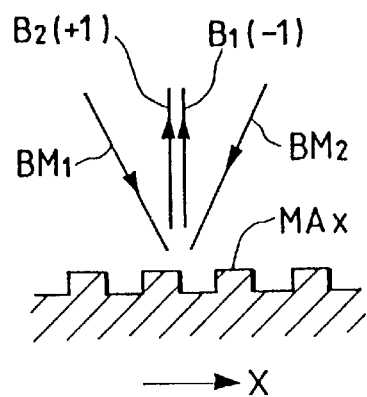
FIG. 5B is an explanatory diagram for explaining the method of detecting an alignment mark by the LIA system.

FIG. 5B shows an example of a wafer mark preferable for the LIA system. In FIG. 5B, a wafer mark MAx is like a diffraction grating arranged with predetermined pitches along the X direction. When detecting the wafer mark MAx, two laser beams $BM_1$ and $BM_2$ are emitted from the LIA optical system 45 (FIG. 3) constituting the alignment sensor 17 thereby to illuminate the wafer mark MAx at a predetermined crossing angle. The crossing angle of the two laser beams $BM_1$ and $BM_2$ and the pitches of the wafer mark MAx in the X direction are set such that the −primary diffraction light $B_1$ (−1) from the wafer mark MAx by the laser beam $BM_1$ and the +primary diffraction light $B_2$ (+1) from the wafer mark MAx by the laser beam BM2 are directed in the same direction (optical axis direction of the projection optical system 13 in this embodiment). The interference light of the −primary diffraction light $B_1$ (−1) and the +primary diffraction light $B_2$ (+1) from the wafer mark MAx are received by the photoelectric detecting device 52. Then, a photoelectric signal SDw from the photoelectric detecting device 52 is supplied to the LIA calculating unit 58. The LIA calculating unit 58 calculates the deviation of the position of the wafer mark MAx in the X direction from the phase difference of the reference signal SR and the photoelectric signal SDw. And, by using the position signal PDs from the interferometer 15, the LIA obtains the coordinate position of the wafer stage WS when the deviation becomes zero.

Figure 5C:
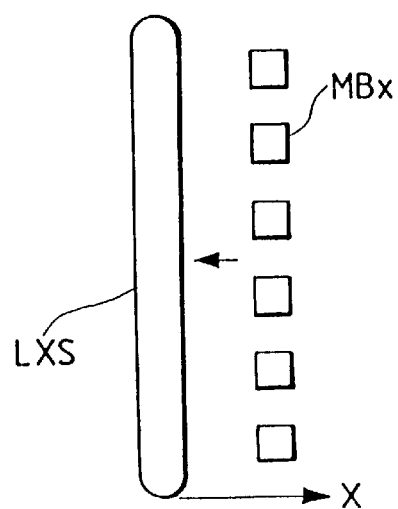
FIG. 5C is an explanatory diagram for explaining the method of detecting an alignment mark by the LSA system.

FIG. 5C shows an example of a wafer mark preferable for the LSA system. In FIG. 5C, a wafer mark MBx consists of six dot marks arranged at predetermined pitches in the Y direction. When detecting the wafer mark MBx, a laser beam is-emitted from the LSA optical system 46 (FIG. 3) constituting the alignment sensor 17 to illuminate the wafer W with a spot light LXS elongated in the Y direction like a strip. And, the wafer stage WS is driven in the X direction to effect relative scanning of the wafer mark MBx and the spot light LXS. The diffraction light occurring from the wafer mark MBs is received by the photoelectric device 52. A photoelectric signal SDi from the photoelectric detecting device 52 is supplied to the LSA calculating unit 57, which obtains the coordinate position of the wafer mark MBx in the X direction by a predetermined calculation process.

Next, in the step 102, nonlinear error amounts of the respective sample shots SA1 to SA9 are obtained. Therefor, based on the coordinate positions upon the design of the wafer marks and the coordinate positions measured in the step 101, the EGA calculating unit 62 obtains six transformation parameters a to f satisfying the equation (1) by using, e.g., the method of least squares. That is, if the coordinate position of the n-th sample shot SAn measured in the step 101 is ($XM_n$, $YM_n$) and the coordinate position obtained by substituting the coordinate position upon the design in the equation (1) is ($X_n$, $Y_n$), the residual error element is expressed by the following equation. It is to be noted that the value of m is 9.

$$\text{Residual error element} = \sum_{n=1}^{m} \{(X_n - XM_n)^2 + (Y_n - YM_n)^2\} \quad (2)$$

And, the values of the transformation parameters a to f of the equation (1) are obtained such that the residual error element becomes minimum. This is the so-called EGA calculation.

Next, the EGA calculating unit 62 calculates respective coordinate positions of the nine sample shots SA1 to SA9 by the use of the model function (equation (1)) including the obtained transformation parameters a to f. Further, the EGA calculating unit 62 subtracts the coordinate position obtained by the EGA calculation from the coordinate position ($XM_n$, $YM_n$) measured in the step 101 to obtain the nonlinear error amount (Pi, Qi) for each sample shot. The obtained nine nonlinear error amounts are stored in the memory 63.

Figure 7A:
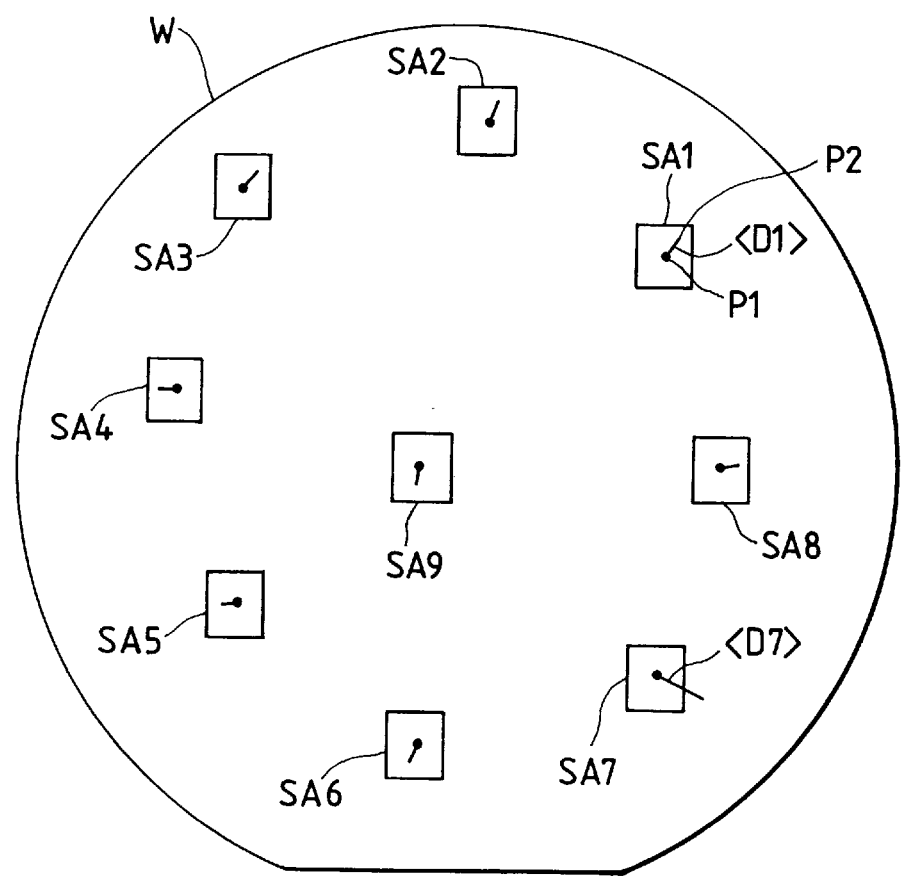
FIG. 7A shows the linear error vectors of sample shots on the wafer.

FIG. 7A shows an example of the respective nonlinear error amounts of the sample shots SA1 to SA9 obtained in the step 102 exaggeratedly. In FIG. 7A, the nonlinear error amount of the sample shot SA1 is indicated by the nonlinear error vector <D1>. The start point P1 of the nonlinear vector <D1> represents the coordinate position (the coordinate position including the linear error amount) calculated in the step 102 while the end point P2 thereof represents the coordinate position measured in the step 101. Therefore, regarding the vector <D1>, <D1>=(P1, Q1) holds. In FIG. 7A, the nonlinear error amounts of the other sample shots are also indicated by the respective nonlinear error vectors.

Next, in the step 103, it is checked whether there is a "peculiar shot" in the nine sample shots. Then, the X elements of the nonlinear error amounts (Pi, Qi) of the sample shots SAi (i=1 to 9) are averaged to obtain the average value $Pi_0$ and the Y elements thereof are averaged to obtain the average value $Qi_0$. Further, the deviation (Pi–$Pi_0$) of the X element of the nonlinear error amount of each sample shot and the deviation (Qi–$Qi_0$) of the Y element thereof are obtained. Next, when there is a sample shot in which the value of $\{(Pi-Pi_0)^2+(Qi-Qi_0)^2\}^{1/2}$ (the absolute value of the deviation vector) exceeds a predetermined allowed value, the sample shot is specified as the "peculiar shot".

When there is no peculiar shot among the sample shots SA1 to SA9, the alignment is executed by the conventional EGA method in the step 112. Namely, the EGA calculating unit 62 calculates coordinate positions of all the exposure shots ESi on the wafer W from the equation (1) by using the transformation parameters a to f obtained in the step 102 and the arrangement coordinate values upon the design. The calculated coordinate positions are sent to the system controller 65. Further, the system controller 65 adds the base line amount of the FIA system and each of the coordinate positions calculated by the EGA calculating unit 62 to correct the coordinate positions for the respective exposure shots. The corrected coordinate positions (target positions) are output to the stage controller 66. Then, the stage controller 66 positions the wafer stage WS successively in accordance with the input coordinate positions and the image of the reticle pattern is projected and exposed on each of the exposure shot areas. Thereafter, in the step 113, the exposure operation for the following wafer is carried out.

Figure 7B:
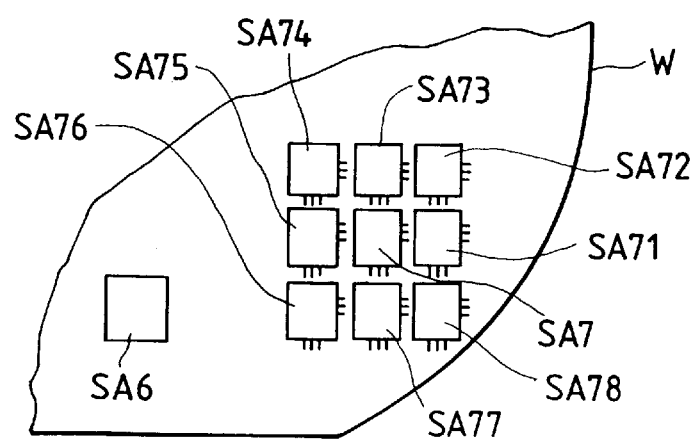
FIG. 7B shows alternative shots set around a sample shot in FIG. 7A.

On the other hand, when among the nine sample shots in FIG. 7A, e.g., the absolute value of the deviation vector of the nonlinear error vector <D7> of the sample shot SA7 exceeds the allowed value, i.e., the sample shot SA7 is the peculiar shot, the operation goes from the step 103 to the step 104. Then, as shown in FIG. 7B, it may be at least one exposure shot, but eight exposure shots located in the peripheral area of the sample shot SA7 are selected newly as sample shots SA71 to SA78 and the respective coordinate values of the sample shots SA71 to SA78 on the stage coordinate system XY are measured.

Next, in the step 105, the correlation degree between the nonlinear error amount of the sample shot SA7 and the nonlinear error amounts of the eight sample shots SA71 to SA78 is checked. Then, by using the coordinate positions of the sample shot SA7 and the sample shots SA71 to SA78 measured in the steps 101 and 104, the transformation parameters a to f of the model function (equation (1)) are calculated by means of the least squares method. And, respective coordinate positions of the nine sample shots SA7 and SA71 to SA78 are calculated by using the model function (equation (1)) including the calculated parameters a to f. Further, the respective calculated coordinate positions of the sample shots SA7 and SA71 to SA78 are subtracted from the coordinate positions thereof measured in the steps 101 and 104 to obtain the nonlinear error amounts (P'7, Q'7) and (P71, Q71) to (P78, Q78). The nonlinear error amount (P'7, Q'7) of the sample shot SA7 is slightly different from the nonlinear error amount (P7, Q7) thereof obtained in the step 102 and therefore recalculated here. Also, when calculating the transformation parameters a to f in the step 105, the respective coordinate positions of the sample shots SA1 to SA6, SA8 and SA9 measured in the step 101 may be used together.

Next, the average value $P_0$ of the X elements of the nine nonlinear error amounts of the sample shot SA7 and the sample shots SA71 to SA78 as well as the average value $Q_0$ of the Y elements thereof are obtained. Then, the average value ($P_0$, $Q_0$) is subtracted from each of the nonlinear error amounts of the sample shots SA7 and SA71 to SA78 to obtain the deviation vectors (P'7–$P_0$, Q'7–$Q_0$), (P71–$P_0$, Q71–$Q_0$) to (P78–$P_0$, Q78–$Q_0$). The absolute values of the nine deviation vectors are called "noncorrelation degrees". When the respective nine noncorrelations exceed the predetermined allowed value, it is deemed that there is no correlation between the sample shot SA7 and the sample shots SA71 to SA78.

Figure 8A:
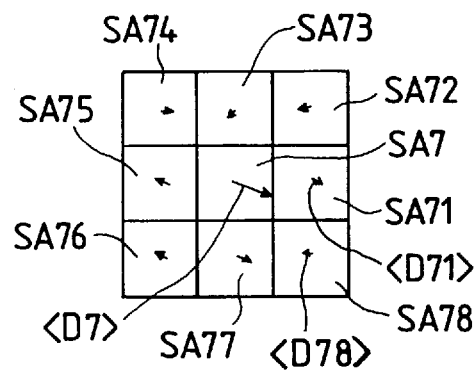
FIGS. 8A and 8B show examples of the trends of the nonlinear error amounts of the sample shot and the alternative shots.

Then, in the step 106, the respective nine noncorrelations and the allowed value are compared. When at least one of the nine noncorrelation degrees is larger than the allowed value as shown in FIG. 8A, it is judged that the trend of the nonlinear error of the sample shot SA7 is different from the trends of the nonlinear errors of the sample shots SA71 to SA78 around the sample shot SA7, i.e., the result of the measurement of the sample shot SA7 is a measurement error caused by the damaged or scratched wafer mark. In FIG. 8A, the trend of the nonlinear error vector <D7> of the sample shot SA7 is different from the trends of the nonlinear error vectors <D71> to <D78> around the nonlinear error vector <D7>.

Next, in the step 110, the transformation parameters a to f of the model function (equation (1)) are calculated by the least squares method by using the coordinate positions of the eight sample shots SA1 to SA6, SA8 and SA9 excluding the peculiar shot SA7. Namely, the values of the transformation parameters a to f are obtained such that the residual error element obtained by subtracting the residual error element of the sample shot SA7 from the residual error element of the above equation (2) becomes minimum. Then, coordinate positions of a plurality of exposure shots on the wafer are calculated from the equation (1) based on the transformation parameters a to f and the coordinate positions upon the design. As a result, the wafer stage WS is positioned successively in accordance with the calculated coordinate positions and the image of the reticle pattern is exposed on each of the plurality of exposure shots. Thereafter, in the step 111, the exposure process for the following wafer is executed.

When the process condition of the wafer W is preferable and it is deemed that the occurrence of the peculiar shot is not necessarily the measurement error caused by the damaged or scratched wafer mark, the measurement result of the peculiar shot SA7 may be assumed to be right. At this time, when exposing the peculiar shot SA7, alignment may be performed based on the result of measuring the coordinate position independently of the others by the die-by-die method. Besides, when exposing the peculiar shot SA7, the weighting EGA method to be described below may be adopted. In that case, respective weights given to the coordinate positions of the sample shots SA71 to SA78 around the sample shot SA7 are made larger than respective weights given to the coordinate positions of the sample shots SA1 to SA6, SA8 and SA9. Then, the coordinate position of the peculiar shot SA7 is calculated and the wafer stage WS is positioned in accordance with the calculated coordinate position.

Figure 8B:
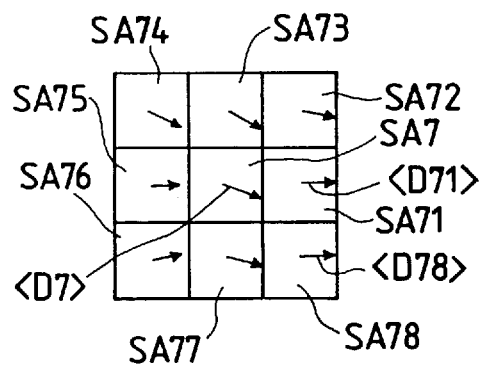

On the other hand, in the step 106, when all the nine noncorrelation degrees are equal to or less than the allowed value, the trends of the nonlinear errors of the sample shot SA7 and the sample shots SA71 to SA78 around the sample shot SA7 are the same. In this case, it is judged that there is a partial nonlinear distortion in an area SA70 (refer to FIG. 5A) including the sample shots SA7 and SA71 to SA78 and the operation goes to the step 107. In FIG. 8B, the trend of the nonlinear error vector <D7> of the sample shot SA7 is approximately equal to the trends of the nonlinear error vectors <D71> and <D78>.

Figure 9:
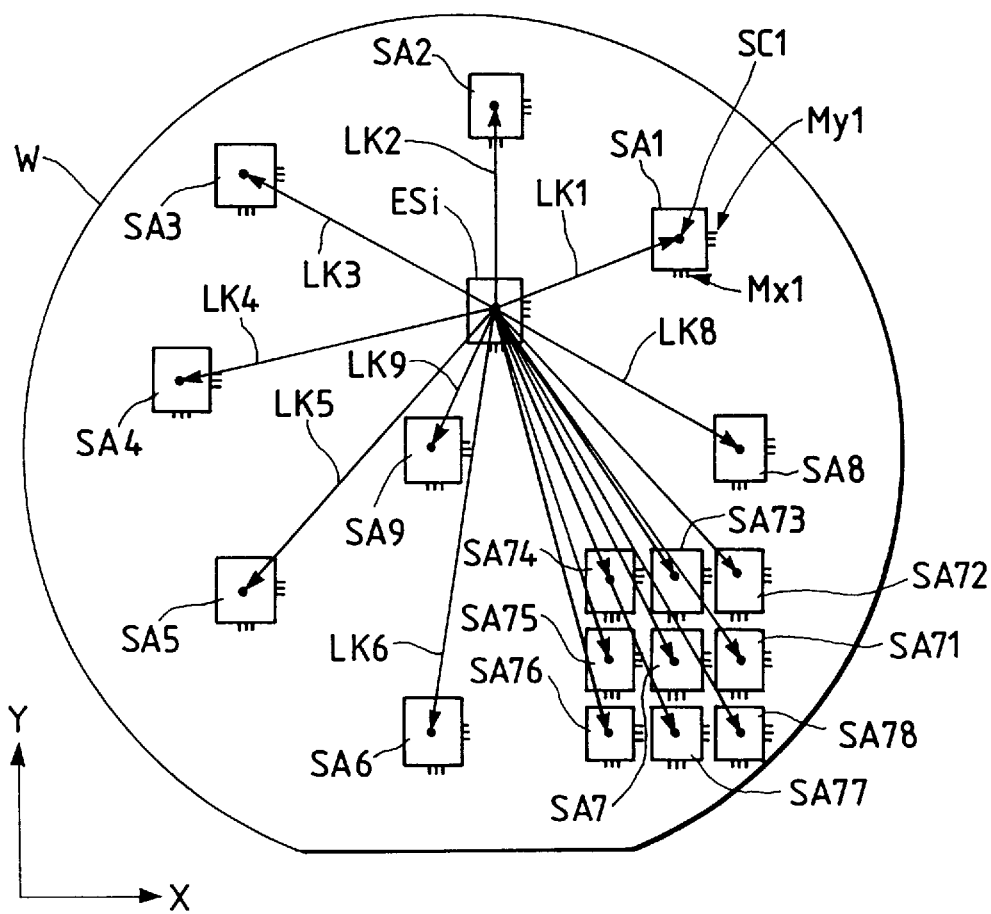
FIG. 9 is an explanatory diagram for explaining a first method of giving the weight to each sample shot at the time of the alignment of the exposure shot ESi on the wafer.

When there is the partial distortion in the area SA70 on the wafer W, the respective coordinate positions of all the exposure shots ES1 to ESN on the wafer W are calculated by the use of the weighting EGA method. In the weighting EGA method, when exposing the exposure shot ESi on the wafer as shown in FIG. 9, the weight $W_{in}$ is given to the respective 17 sample shots SA1 to SA9 and SA71 to SA78. And, by using the coordinate positions $(XM_n, YM_n)$ of the 17 ample shots measured in the steps 101 and 104, the coordinate positions $(X_n, Y_n)$ obtained by substituting the coordinate positions upon the design of the sample shots in the equation (1) and the weight $W_{in}$, the residual error element Ei of the exposure shot ESi is defined by the following equation. The value of m is 17 in the equation.

$$Ei = \sum_{n=1}^{m} W_{in}\{(X_n - XM_n)^2 + (Y_n - YM_n)^2\} \quad (3)$$

Then, the value of the transformation parameters a to f of the equation (1) are obtained such that the residual error element Ei becomes minimum. This is called the weighting EGA calculation. Next, the coordinate position of the exposure shot ESi on the wafer is calculated by the use of the model function (equation (1)) including the obtained transformation parameters a to f. As above, in the weighting EGA method, the coordinate positions are calculated by obtaining the transformation parameters a to f for each exposure shot such that the residual error element Ei of the equation (3) becomes minimum. Thereafter, the wafer stage WS is successively positioned in accordance with the calculated coordinate positions to expose the image of the pattern of the reticle R on each exposure shot (steps 107 and 108).

In this embodiment, when calculating the coordinate positions of exposure shots in the area SA70 having the nonlinear distortion by the weighting EGA method in the step 107, the respective weights given to the nine sample shots SA7 and SA71 to SA78 in the area SA70 are made larger than the respective weights given to the eight sample shots SA1 to SA6, SA8 and SA9 located outside the area 70. On the other hand, when calculating the coordinate positions of the exposure shots located outside the area SA70 by the weighting EGA method in the step 108, the respective weights given to the nine sample shots SA7 and SA71 to SA78 in the area SA70 are made smaller than the respective weights given to the eight sample shots SA1 to SA6, SA8 and SA9 located outside the area SA70. Therefore, it is possible to position each of the entire exposure shots on the wafer W to the exposure position accurately.

Then, the method of making the above-mentioned weight $W_{in}$ optimum will be described. Here, the weight $W_{in}$ given to the n-th sample shot is defined by the distance LKn between the exposure shot ESi and the n-th sample shot as follows:

$$W_{in} = \frac{1}{\sqrt{2\pi Si}} \exp\{-LKn^2/(2Si)\} \quad (4)$$

As is apparent from the equation, the shorter the distance LKn becomes, the larger the weight $W_{in}$ becomes. In the equation (4), when the value of the parameter Si is increased, the result approaches that of the conventional EGA method. On the other hand, when the value of the parameter Si is decreased, the result approaches that of the die-by-die method.

Further, in this embodiment, the parameter Si is set such that a ratio r defined below becomes equal to or less than a predetermined value $r_0$ for each exposure shot. The ratio r is the value determined by dividing "the sum of the weight $W_{in}$ given to the sample shots outside the area SA70 when the coordinate positions of the exposure shots in the area SA70 are calculated" by "the sum of the weight $W_{in}$ given to the sample shots in the area SA70 when the coordinate positions of the exposure shots in the area SA70 are calculated".

Accordingly, in the step 107, when transferring the reticle pattern to each of the exposure shots in the area SA70 on the wafer W of FIG. 5A, the comparatively smaller weight $W_{in}$ is given to the respective eight sample shots located outside the area SA70 to obtain those coordinate positions. At this time, the comparatively larger weight $W_{in}$ is given to the nine sample shots in the area SA70. On the other hand, in the step 108, when transferring the reticle pattern to each of the exposure shots located outside the area SA70, the weights given to the sample shots in the area SA70 are smaller than the weights given to the sample shots outside the area SA70 to obtain those coordinate positions.

After the image of the reticle pattern is transferred to each of the exposure shots on the wafer W by the weighting EGA method in the steps 107 and 108 as above, the exposure process for the following wafer is conducted in the step 109.

Further, as another method of making the weight $W_{in}$ optimum, when it is judged that there is correlation between the peculiar shot SA7 and the sample shots SA71 to SA78 surrounding the peculiar shot SA7 in the step 106, the coordinate positions of all or the greater part of the exposure shots on the wafer W of FIG. 5A may be measured to obtain those nonlinear error amounts. In this case, the weight $W_{in}$ is determined in accordance with the distribution of those nonlinear error amounts. Also, the coordinate positions may be obtained by the weighting EGA method by changing the distribution of the weight $W_{in}$ variously and the weight $W_{in}$ when the residual error element is minimized may be used.

Figure 1:
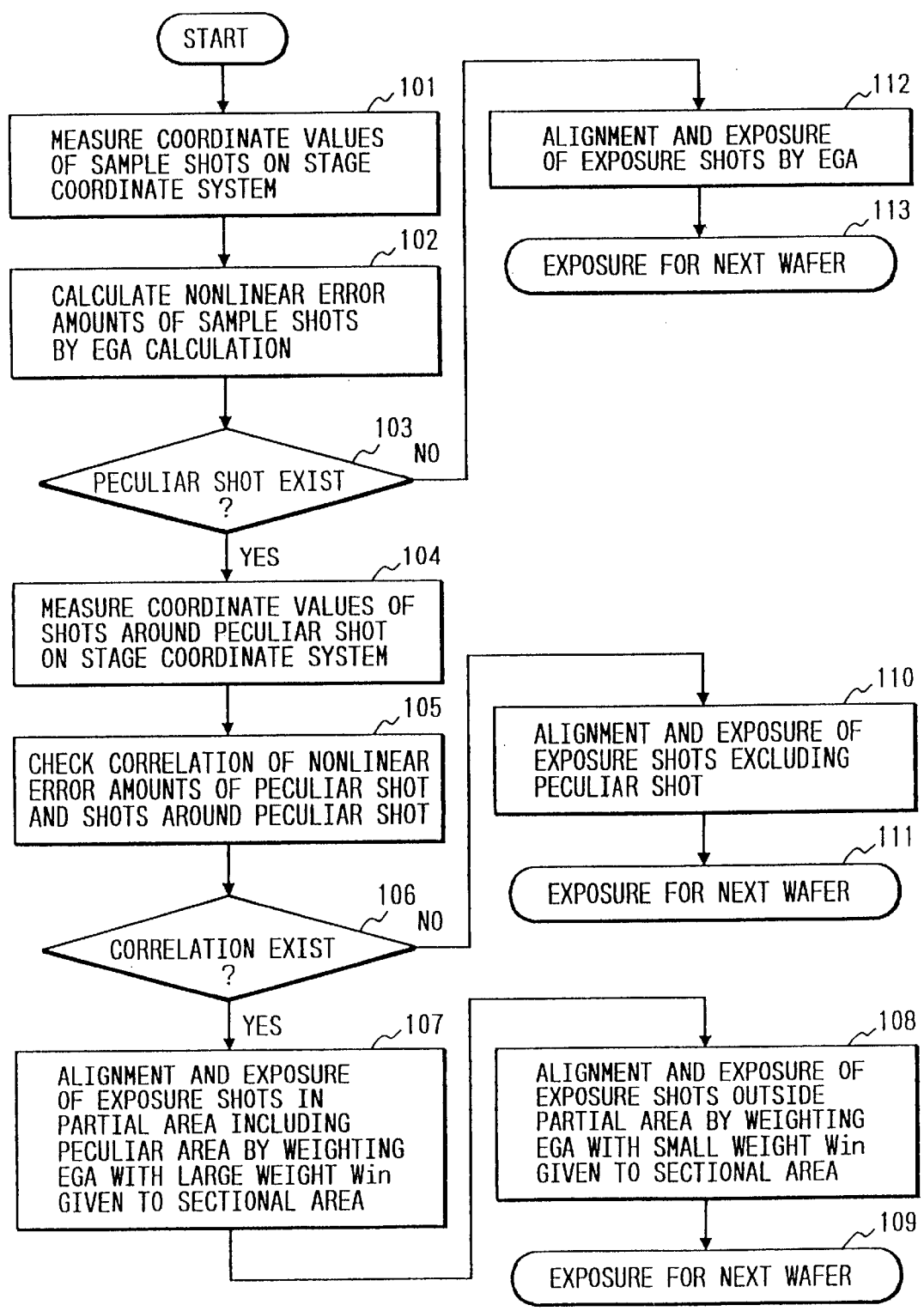
FIG. 1 is a flowchart showing the alignment method of a first embodiment according to the present invention.

Also, in the step 105 in FIG. 1, in order to check the correlation between the sample shot SA7 and the sample shots SA71 to SA78 around the sample shot SA7, the coordinate positions of the nine sample shots SA7 and SA71 to SA78 are calculated by the use of the transformation parameters a to f recalculated by the EGA calculation to obtain the nine nonlinear-error amounts (P'7, Q'7) and (P71, Q71) to (P78, Q78). However, in the step 105, the above correlation can be checked without re-executing the EGA calculation (calculation of the new transformation parameters a to f). Namely, the transformation parameters obtained in the step 102 may be used. In this case, the coordinate positions of the eight sample shots SA71 to SA78 are calculated by the use of the model function (equation (1)) including the transformation parameters a to f obtained in the step 102. Then, in each of the eight sample shots SA71 to SA78, the calculated coordinate position is subtracted from the coordinate position measured in the step 104 to obtain its nonlinear error amount. As the nonlinear error amount of the sample shot SA7 has been obtained in the step 102, the eight nonlinear error amounts obtained here and the nonlinear error amount obtained in the step 102 are used to obtain the average value ($P_0$, $Q_0$). Thereafter, if the deviation vectors, i.e., the noncorrelation degrees are obtained by the use of the average value ($P_0$, $Q_0$), it is possible to check the correlation between the sample shot SA7 and the sample shots SA71 to SA78.

Further, when there is no peculiar shot in the plurality of sample shots as in the step 112 of FIG. 1 but there is nonlinear distortion in the wafer W, the weighting EGA method may be adopted. Also, the weighting EGA method may be adopted in the step 110. At this time, the parameter Si is set to be the common value for the entire sample shots, e.g., the $Si_0$ of the following equation. In the equation (5), D is the weight parameter. When the operator sets the weight parameter D to a predetermined value, the parameter $Si_0$ and the resultant $W_{in}$ are determined automatically.

$$Si_0 = D^2/(8 \cdot \log_e{}^{10}) \tag{5}$$

The physical meaning of the weight parameter D is the range (hereinafter simply called the zone) of the sample shots effective for calculating the coordinate positions of the exposure shots on the wafer. That is, when the zone is large, the number of effective sample shots is increased, so that the result approaches that of the conventional EGA method. On the other hand, when the zone is small, the number of effective sample shots is decreased, so that the result approaches that of the die-by-die method.

Also, the equation for determining the parameter $Si_0$ is not limited to the equation (5) and the following equation can be used wherein the area of the wafer is A [mm²], the number of sample shots is m and the correction coefficient (positive real number) is C.

$$Si_0 = A/(m \cdot C) \tag{6}$$

In the equation (6), the changes of the wafer size (area) and the number of the sample shots are reflected to determine the parameter $Si_0$ thereby to prevent the optimum value of the correction coefficient C to be used for the determination from being varied excessively. When the correction coefficient C is small, the value of the parameters $Si_0$ is increased, approaching the result obtained by the conventional EGA method. On the other hand, when the correction coefficient C is large, the value of the parameter $Si_0$ is decreased, approaching the result obtained by the die-by-die method.

Although the value of the parameter Si is changed for each exposure shot in accordance with the nonlinear distortion amounts on the wafer in the steps 107 and 108 of this embodiment, the value of the parameter Si may be set based on the value of the parameter $Si_0$ of the equation (5) or (6), thereby increasing or decreasing this reference value.

Figure 10:
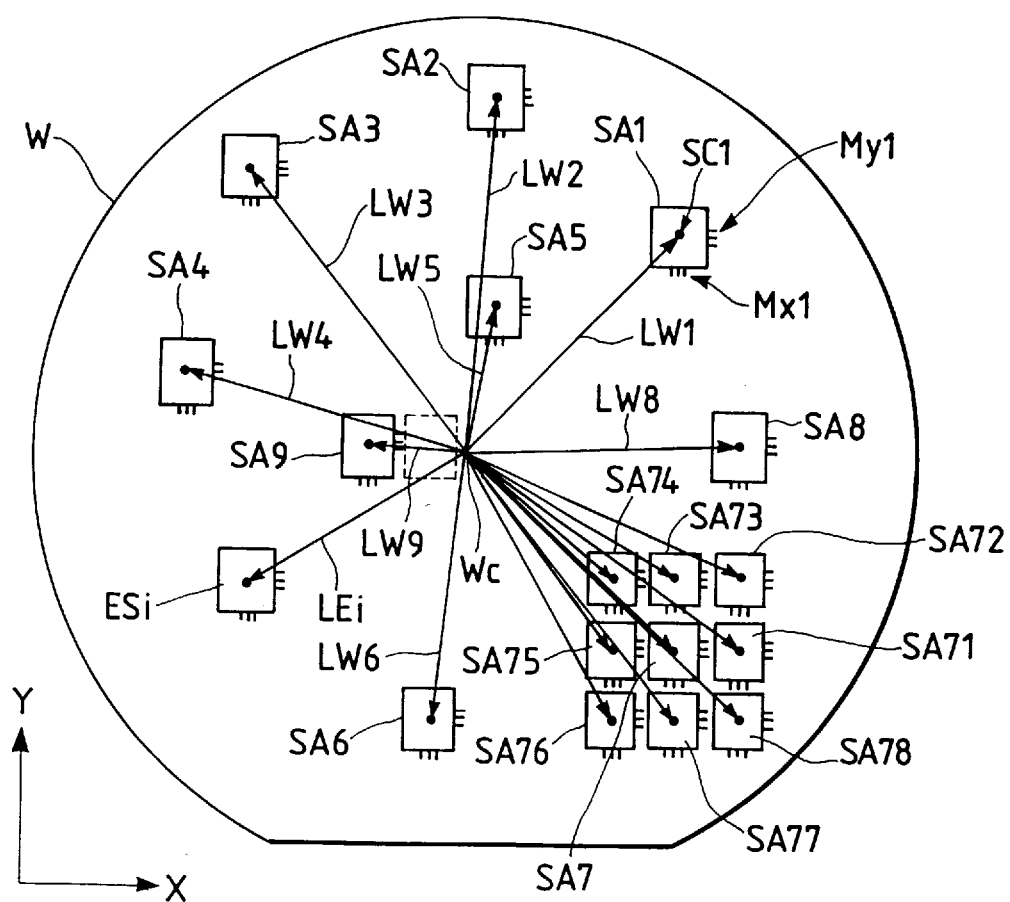
FIG. 10 is an explanatory diagram for explaining a second method of giving the weight to each sample shot at the time of the alignment of the exposure shot ESi on the wafer.

Also, although the weight $W_{in}$ is determined from the equation (4) in accordance with the parameter Si, the weight $W_{in}$' obtained from the following equation in accordance with the parameter Si may be used. In this case, as shown in FIG. 10, the distance (radius) between the center point of the distortion of the wafer (e.g., the center of the point symmetry of the nonlinear distortion), e.g., the wafer center and the exposure shot ESi on the wafer is made to be LEi. And, the distances between the wafer center and m (m=17 in FIG. 10) sample shots are made-to be LW1 to LWm. Then, the weight $W_{in}$ defined by the following equation is given to respective measurement results of the m sample shots in accordance with the distance LEi and the distances LW1 to LWm.

$$W_{in}' = \frac{1}{\sqrt{2\pi Si}} \exp\{-(LEi - LWn)^2/(2Si)\} \tag{7}$$

As is apparent from the equation (7), the closer the distance LWn between the sample shot and the center point of the distortion (wafer center) becomes with respect to the distance between the wafer center and the i-th exposure shot ESi, the larger the weight $W_{in}$ given to the alignment data becomes. Alternately, the largest weight $W_{in}$ is given to the alignment data of the sample shots positioned on a circle drawn by the radius LEi with the wafer center as its center while the weight $W_{in}$ given to the alignment data is decreased as the sample shots become far away from the circle in the radius direction.

Figure 11:
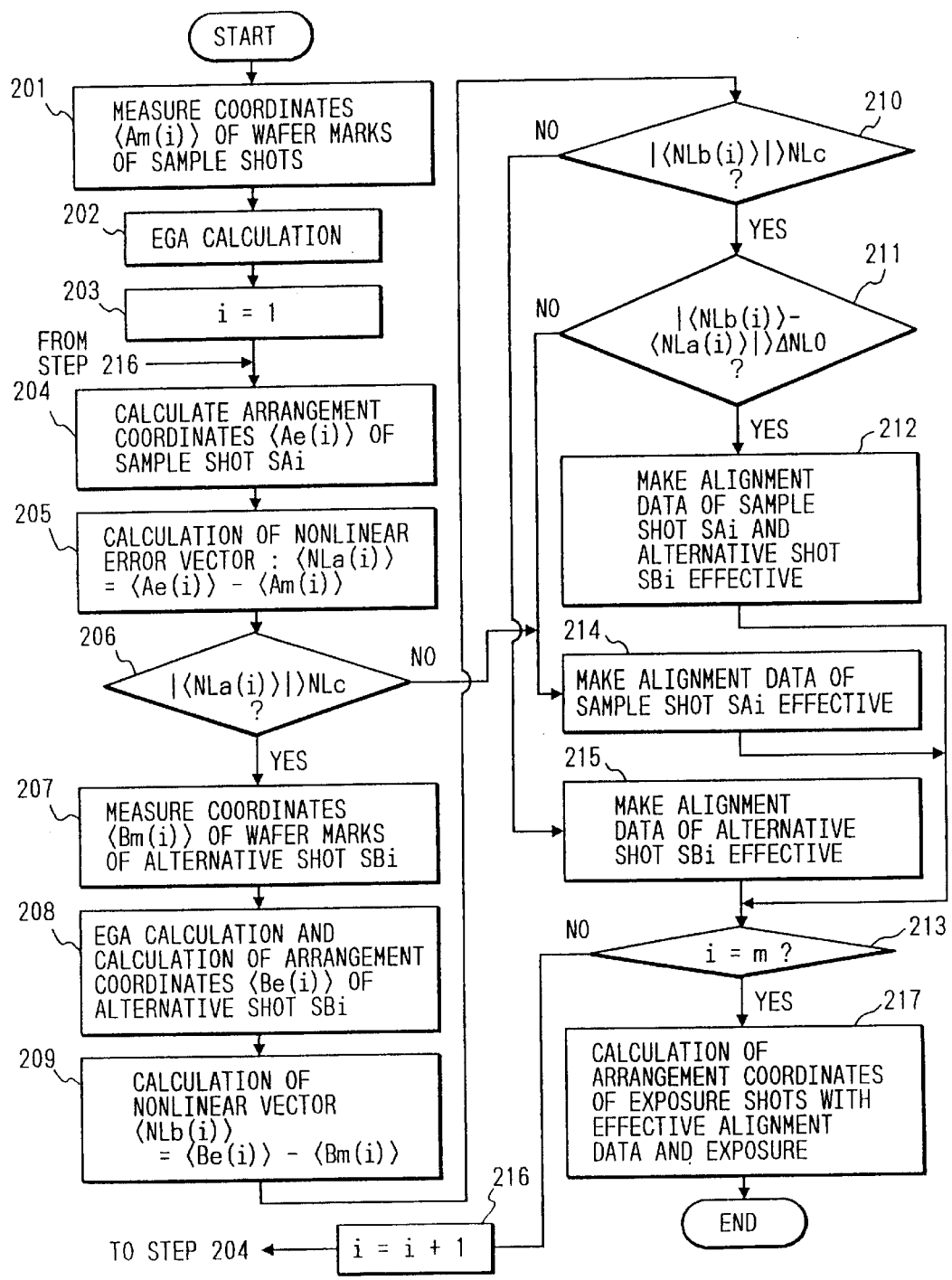
FIG. 11 is a flowchart showing the alignment method of a second embodiment according to the present invention.
Figure 12:
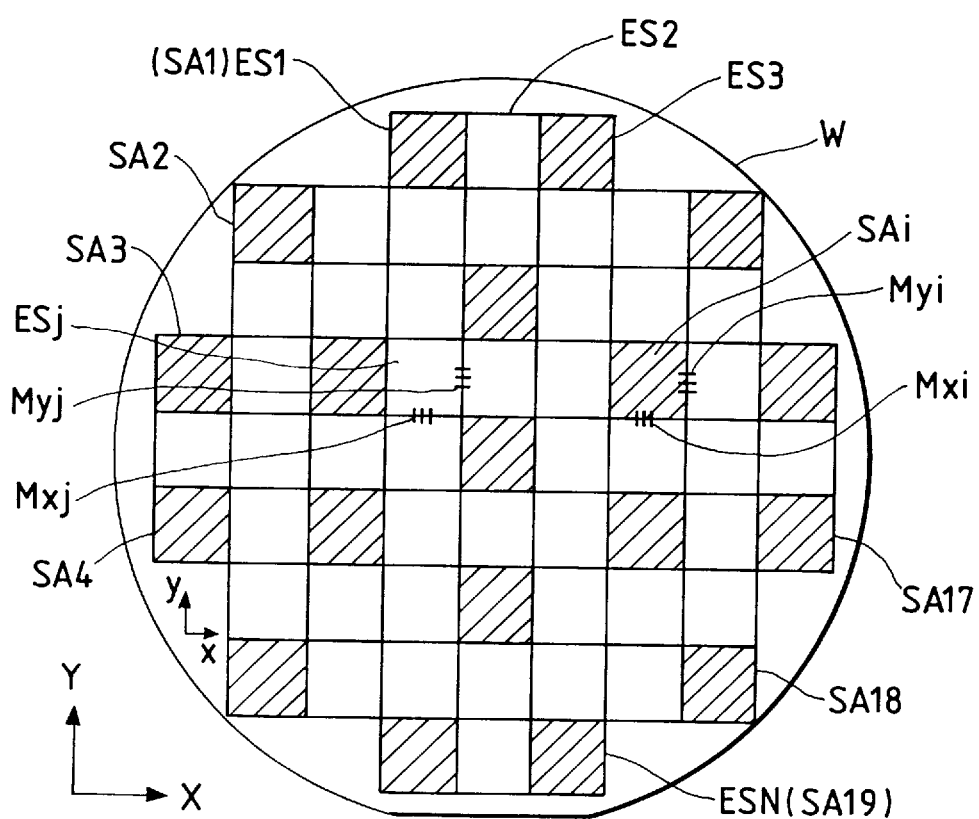
FIG. 12 shows the arrangement of the exposure shots on a wafer to be used in the second embodiment.

Next, a second embodiment of the present invention will be described with reference to FIG. 11. FIG. 11 is a flowchart showing the exposure sequence including the alignment method of this embodiment. First, the main control system 18 loads a wafer W to be exposed on the wafer stage WS. FIG. 12 shows the arrangement of shots of the wafer W to be used in this embodiment which is basically the same as that of the wafer W in FIG. 5.

In the step 201 in FIG. 11, the system controller 65 detects respective wafer marks of 19 sample shots selected from N exposure shots on the wafer W of FIG. 12 by using the two sets of FIA systems. Further, the FIA calculating unit 59 processes the waveforms of the image pick-up signals SV from the FIA systems for each of the wafer marks to detect the deviation of the positions of the respective wafer marks thereby to obtain the coordinate position <Am(i)>(i=1 to 19) of each sample shot. The operation of the step 201 is the same as that of the step 101 (FIG. 1) of the first embodiment. In the step 202, the EGA calculating unit 62 obtains the transformation parameters a to f of the equation (1) by using the alignment data (coordinate positions) of the sample shots SA1 to SA19 by means of the least squares method such that the residual error element of the equation (2) is minimized. Next, in the step 203, the variable i is set to be 1. Then, in the step 204, the EGA calculating unit 62 calculates the coordinate position (Xi, Yi) of the i-th (here i=1) sample shot SAi by using the transformation parameters a to f obtained in the step 202. Namely, the coordinate position (Xi, Yi) is calculated by substituting the coordinate position upon the design of the sample shot SAi in the model function (equation (1)) including the transformation parameters a to f. The calculated coordinate position (Xi, Yi) is expressed by the vector form coordinates <Ae(i)>.

Next, in the step 205, the coordinate <Am(i)> measured in the step 201 is subtracted from the coordinates <Ae(i)> obtained in the step 204 to obtain the nonlinear error vector <NLa(i)> of the sample shot SAi. Here, as the linear error is eliminated from the arrangement error of the sample shot SAi by this subtraction, its nonlinear error vector <NLa(i)> can be obtained. Further, in the step 206, it is judged whether the absolute value of the nonlinear error vector <NLa(i)> is larger than a predetermined allowed value NLc. When the absolute value of the nonlinear error vector is equal to or less than the allowed value NLc, i.e., |<NLa(i)>|≦NLc holds, it is judged that the nonlinear error amount of the sample shot SAi is small and it is not a peculiar shot. Accordingly, when |<NLa(i)>|≦NLc holds, the operation goes to the step 214, wherein it is determined that the alignment data (coordinate position) of the sample shot SAi is effective, i.e., the alignment data is to be used in the following step 217 (weighting EGA method). And, the operation goes to the step 213.

On the other hand, when |<NLa(i)>|>NLc holds in the step 206, the operation moves to the step 207. In the step 207, the system controller 65 selects an exposure shot adjacent to the sample shot SAi as an alternative shot SB and detects the wafer marks of the alternative shot SBi by the use of the FIA systems. Then, the FIA calculating unit 59 processes the waveforms of the image pick-up signals SV from the FIA systems to obtain the coordinates <BM(i)> of the alternative shot SBi on the stage coordinate system XY.

Figure 13A:
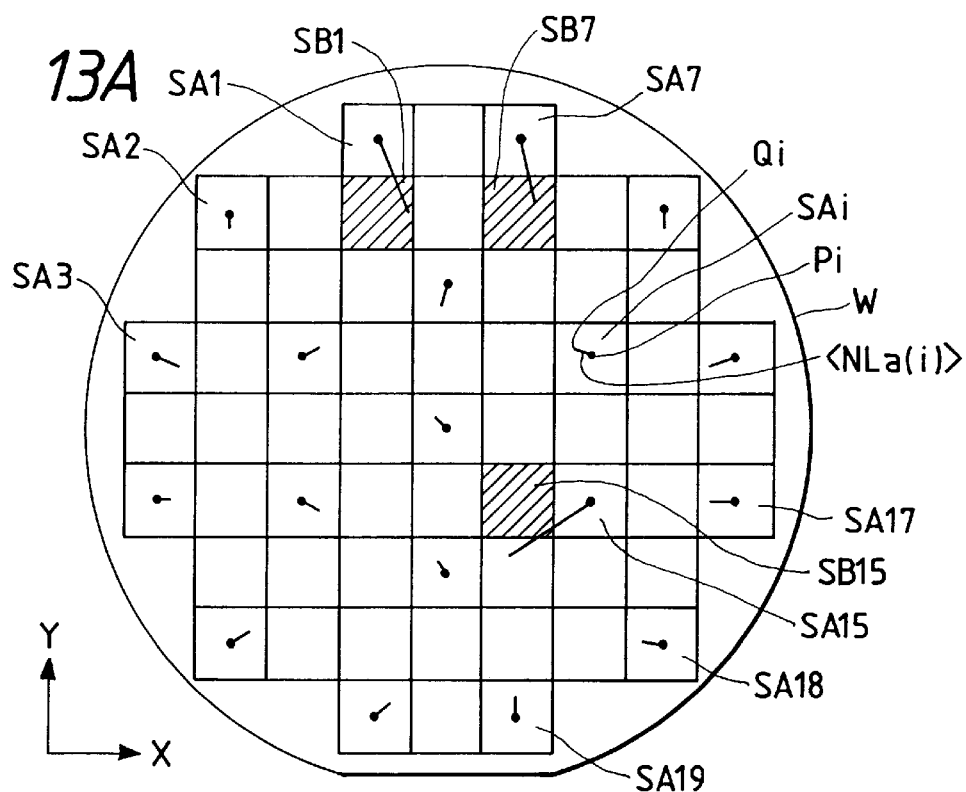
FIG. 13A shows an example of the distribution of the nonlinear error amounts of the sample shots in FIG. 12.

FIG. 13A shows an example of the respective nonlinear error amounts of the sample shots SA1 to SA19 obtained in the step 205 exaggeratedly. In FIG. 13A, the nonlinear error amount in the sample shot SAi is represented by the vector <NLa(i)>. The start point Pi of the vector <NLa(i)> represents the coordinate position (including the linear error amount) of the sample shot SAi calculated in the step 204 while the end point Qi thereof represents the coordinate position of the sample shot SAi measured in the step 201. Also, the nonlinear error amounts of the other sample shots are represented by the vectors. In FIG. 13A, the respective nonlinear error vectors of the three sample shots SA1, SA7 and SA15 are larger than the allowed value. Then, e.g., the exposure shots SB1, SB7 and SB15 are selected as the exposure shots adjacent to the sample shots SA1, SA7 and SA15 as the alternative shots and the respective coordinate positions of the selected three alternative shots on the stage coordinate system XY are obtained.

After obtaining the coordinates <Bm(i)> of the alternative shot SBi in the step 207, the EGA calculation is executed by the use of the respective coordinate positions of the alternative shots SBi and the sample shots excluding the i-th sample shot SAi in the step 208. Namely, the transformation parameters a to f of the equation (1) are obtained such that the residual error element of the equation (2) is minimized. Further, the coordinate position <Be(i)> of the alternative shot SBi is calculated by the use of these transformation parameters a to f from the equation (1).

Next, in the step 209, the coordinates <Bm(i)> measured in the step 207 are subtracted from the coordinates <Be(i)> calculated in the step 208 to obtain the nonlinear error vector <NLb(i)> of the alternative shot SBi. Then, in the step 210, it is judged whether the absolute value of the nonlinear error vector <NLb(i)> is larger than the allowed value NLc. When |<NLb(i)>|>NLc holds, the operation goes to the step 211. On the other hand, when |<NLb(i)>|≦NLc holds, the nonlinear error amount of the alternative shot SBi is deemed to be small. Then, it is judged that the measured nonlinear error amount of the sample shot SA is caused by the measurement error and the operation goes to the step 215. In the step 215, it is determined that the coordinate position of the alternative shot SBi is effective, i.e., its coordinate position is to be used in the following step 217 (weighting EGA method) and the operation goes to the step 213. The coordinate position of the sample shot SAi is not used in the step 217.

In the step 211, the nonlinear error vector <NLa(i)> is compared to the nonlinear error vector <NLb(i)>. That is, the absolute value |<NLb(i)>−<NLa(i)>| of the difference (the change amount of the nonlinear error) of both vectors is compared to the allowed change amount $\Delta NL_0$ of the nonlinear error amount. When the absolute value is larger than the allowed change amount $\Delta NL_0$, it is judged that the cause of the difference between the nonlinear error amount of the sample shot SAi and that of the alternative shot SBi is not the nonlinear distortion of the wafer but the larger random nonlinear error amount and the operation goes to the step 212. In the step 212, it is determined that both data (coordinate positions) of the sample shot SAi and the alternative SBi are effective, i.e., both data are to be used in the step 217 and the operation goes to the step 213.

On the other hand, when |<NLb(i)>−<NLa(i)>| representing the change amount of the nonlinear error is equal to or less than the allowed change amount $\Delta NL_0$, it is judged that the cause of the difference of the nonlinear errors of both shots is the nonlinear distortion of the wafer and the operation goes to the step 214. In the step 214, the alignment data of the sample shot SAi is made effective, i.e., it is determined that the data is to be used in the step 217.

Next, in the step 213, it is judged whether the variable i has reached the total number m (m=19) of sample shots. When the variable i is i<m, the operation goes to the step 216. After 1 is added to the value of the variable i in the step 216, the operation goes to the step 204 and the above-mentioned operation is repeated. On the other hand, when the variable i is i=m, the operation goes to the step 217.

In the step 217, the weighting EGA method is adopted and the transformation parameters a to f of the equation (1) are obtained for each exposure shot by using a plurality of alignment data of the respective shots made effective in the steps 212, 214 and 215 such that the residual error element Ei of the equation (3) is minimized. At this time, the weight $W_{in}$ of the equation (3) may be determined by using either the weight $W_{in}$ of the equation (4) or that of the equation (7). Although the plurality of alignment data (coordinate positions) used for each of the exposure shots are the same in the weighting EGA method, the distances between each exposure shot and the sample shots or the alternative shots are different. Namely, the weight $W_{in}$ given to the sample shots and the alternative shots is varied for each exposure shot. Then, the transformation parameters a to f are calculated for each exposure shot thereby to calculate the coordinate positions (shot arrangement) of the entire exposure shots on the wafer W. Thereafter, the base line amount is added to the calculated coordinate positions and in accordance with the obtained coordinate positions, the wafer stage WS is successively positioned to expose the reticle pattern on each of the exposure shots on the wafer W. After all the exposure shots on the wafer W have been exposed, the wafer W is replaced with the following wafer and the steps 201 to 217 of FIG. 11 are repeatedly performed therefor.

Figure 13B:
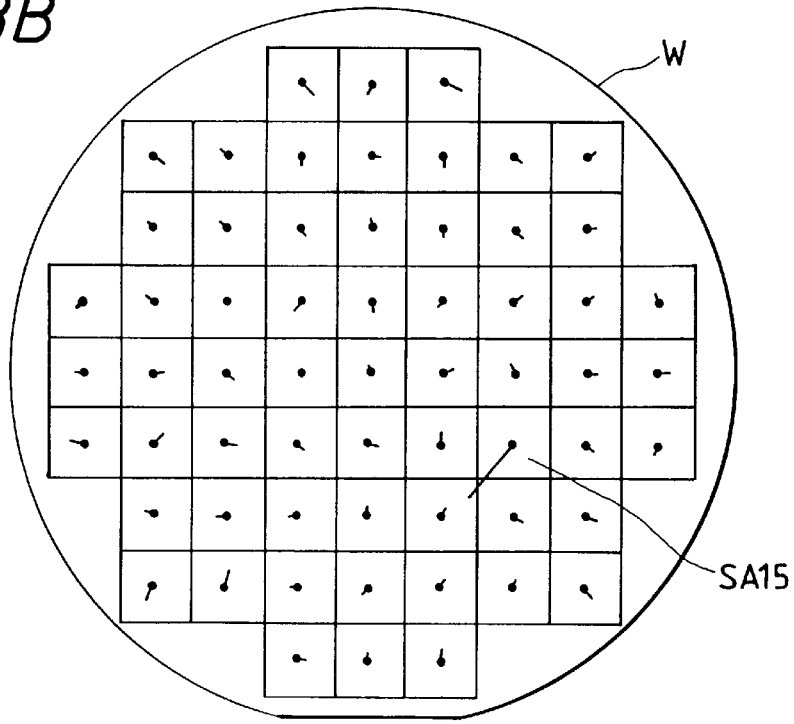
FIG. 13B shows the nonlinear error amounts of the respective exposure shots when the alignment method of the second embodiment is applied to the wafer in FIG. 13A.

FIG. 13B shows the residual error elements (nonlinear error amounts) of the respective exposure shots when the alignment method of this embodiment is applied to the wafer W in FIG. 13A. In FIG. 13A, the 19 sample shots SA1 to SA19 are selected and there are the three sample shots SA1, SA7 and SA15 with the larger nonlinear error amounts. In FIG. 13B, the alternative shots SB1, SB7 and SB15 are located inside the respective sample shots SA1, SA7 and SA15, i.e., the exposure shots closer to the wafer center than the sample shots are selected. Further, the weight parameter D in the equation (5) is set to be 100 mm, the allowed value NLc of the nonlinear error is set to be 0.1 $\mu$m and the allowed change amount $\Delta NL_0$ is set to be 0.04 $\mu$m. Although only the sample shot SA15 has the larger nonlinear error amount, such a foreign sample shot may be subjected to the alignment by the die-by-die method. Also, when the absolute values of the nonlinear error vectors of the entire sample shots are equal to or less than the allowed value (allowed value in EGA) $NL_0$, the alignment may be performed by the conventional EGA method. The allowed value $NL_0$ is, e.g., 0.1 $\mu$m.

Figure 14A:
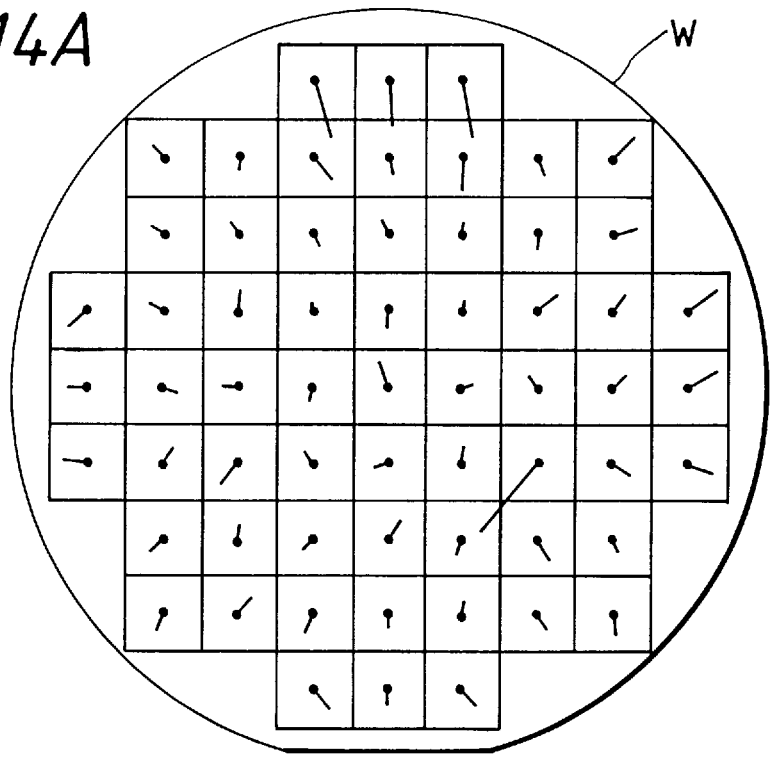
FIG. 14A shows the nonlinear error amounts of the respective exposure shots when the conventional EGA method is applied to the wafer in FIG. 13A.
Figure 14B:
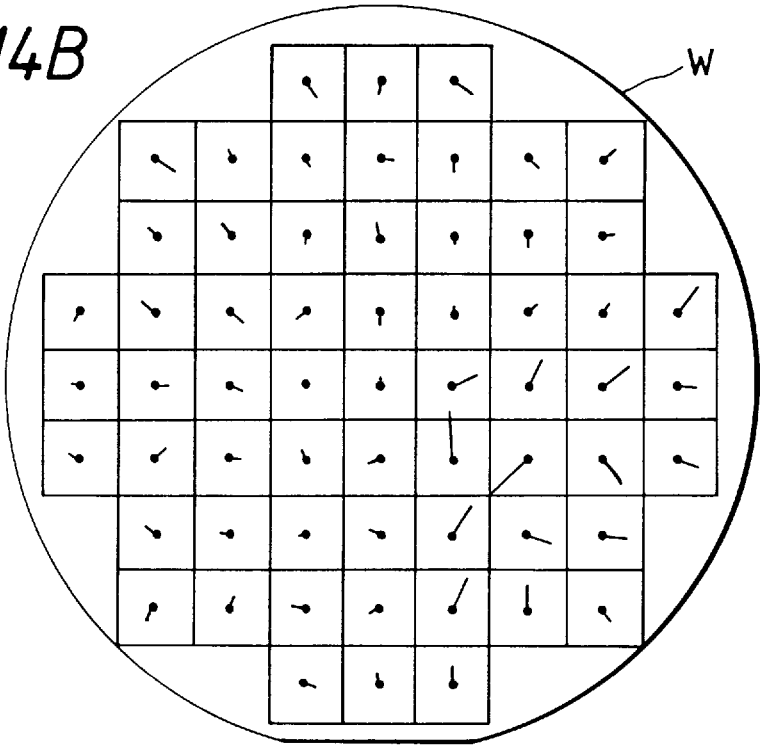
FIG. 14B shows the nonlinear exposure shots when the conventional weighting EGA method is applied to the wafer in FIG. 13A.

FIG. 14A shows nonlinear error vectors of the respective exposure shots when the conventional EGA method is applied to the wafer W in FIG. 13A while FIG. 14B shows nonlinear error vectors of the respective exposure shots when the conventional weighting EGA method is applied thereto. As is apparent from the comparison of FIGS. 13B, 14A and 14B, the nonlinear error amounts become small on the entire surface of the wafer W according to this embodiment.

The present invention is not limited to the above-described embodiments and is applicable to a scan type exposure apparatus disclosed in, e.g., U.S. Pat. No. 5,194,893, a proximity type or contact type exposure apparatus, a repair apparatus for repairing a chip pattern in an exposure shot, an inspecting apparatus for inspecting a chip pattern or the like. Also, the shot arrangement on the wafer, the number of sample shots, the positions of the sample shots, the method of determining the alternative shots, the largeness of the allowed values may be different from the above ones.

What is claimed is:

1. A method of aligning each of a plurality of areas on a substrate and a predetermined position in a static coordinate system for defining a moving position of said substrate, comprising:

the first step of selecting several areas from said plurality of areas as specific areas and measuring respective coordinate positions of said several specific areas on said static coordinate system;

the second step of obtaining respective nonlinear position errors of said several specific areas on said static coordinate system based on said measured coordinate positions;

the third step of specifying, as a peculiar area, an area of said several specific areas where said nonlinear error exceeds a predetermined value and obtaining a coordinate position of at least one said area around said peculiar area on said static coordinate system;

the fourth step of obtaining a nonlinear position error of said at least one area around said peculiar area on said static coordinate system based on said coordinate position obtained in the third step;

the fifth step of judging in accordance with said nonlinear position error obtained in the fourth step whether said coordinate position of said peculiar area is used, prior to calculating respective coordinate positions of said plurality of areas on said substrate by the use of said coordinate positions of said specific areas; and the sixth step of aligning each of the plurality of areas on said substrate with said predetermined position based on said judging in the fifth step.

2. A method according to claim 1, wherein in the fifth step, the nonlinear position error of said at least one area around said peculiar area and that of said peculiar area are compared and when both the position errors have the same trend, said coordinate position of said peculiar area is used in said calculation, while when both the position errors have different trends, said coordinate position of said peculiar area is excluded in said calculating.

3. A method according to claim 1, wherein, in said fourth step, the nonlinear position error of said peculiar area and at least one area of said several specific areas around said peculiar area in said static coordinate system are obtained based on the coordinate position of said peculiar area and the coordinate position obtained in said third step.

4. A method according to claim 1, wherein the sixth step includes:

weighting respective coordinate positions of a plurality of areas which are determined, among the measured coordinate positions, to be used in the calculation for obtaining coordinate positions of each of said plurality of areas on the substrate.

5. A method according to claim 1, wherein the second step comprises the sub-steps of:

calculating respective coordinate positions of said specific areas on said static coordinate system by performing statistic calculation for said coordinate positions measured in the first step; and obtaining said nonlinear position errors for said respective specific areas by subtracting said calculated respective coordinate positions from said measured coordinate positions.

6. A method according to claim 5, wherein the fourth step comprising the sub-steps of:

calculating said coordinate position of said at least one area around said peculiar area on said static coordinate system by the use of the statistic calculation in the second step; and obtaining said nonlinear position error of said at least one area around said peculiar area by subtracting said calculated coordinate position from said coordinate position obtained in the second step.

7. A method of aligning each of a plurality of areas on a substrate and a predetermined position in a static coordinate system for defining a moving position of said substrate, comprising:

the first step of selecting several areas from said plurality of areas as specific areas and measuring respective coordinate positions of said several specific areas on said static coordinate system;

the second step of obtaining respective nonlinear position errors of said several specific areas on said static coordinate system based on said measured coordinate positions;

the third step of specifying, as a peculiar area, an area of said several specific areas where said nonlinear error exceeds a predetermined value and obtaining a coordinate position of at least one said area around said peculiar area on said static coordinate system;

the fourth step of obtaining a nonlinear position error of said at least one area around said peculiar area on said static coordinate system based on said coordinate position obtained in the third step; and the fifth step of selecting, among a plurality of alignment modes for alignment of each of said areas on said substrate, an alignment mode corresponding to the nonlinear position errors obtained in the second and fourth steps, wherein each of said areas on said substrate is aligned with said predetermined position by the use of the selected alignment mode.

8. A method according to claim 7, wherein, in the fifth step, an alignment mode is selected based on a correlation degree between the nonlinear position error of at least one area around said peculiar area and the nonlinear position error of said peculiar area.

9. A method according to claim 7, wherein said plurality of alignment modes include a mode of weighting respective coordinate positions of a plurality of areas among the measured coordinate positions and calculating coordinate positions of each of the areas on said substrate based on the weighted coordinate positions.

10. A method of aligning each of a plurality of areas on a substrate and a predetermined position in a static coordinate system for defining a moving position of said substrate, comprising:

the first step of selecting several areas from said plurality of areas as specific areas and measuring respective coordinate positions of said several specific areas on said static coordinate system;

the second step of obtaining respective nonlinear position errors of said several specific areas on said static coordinate system based on said measured coordinate positions;

the third step of selecting, as an alternative area, at least one said area around a peculiar specific area where said nonlinear position error exceeds a predetermined value and measuring a coordinate position of said alternative area on said static coordinate system;

the fourth step of obtaining a nonlinear position error of said alternative area on said static coordinate system;

the fifth step of, prior to calculating coordinate positions of said plurality of areas on said substrate on said static coordinate system by the use of said coordinate positions of said specific areas, comparing said nonlinear position error of said peculiar specific area and that of said alternative area and determining a plurality of coordinate positions, among said measured coordinate positions, to be used in said calculating; and the sixth step of aligning each of the plurality of areas on said substrate with said predetermined position based on said determined coordinate positions.

11. A method according to claim 10, further comprising:
the seventh step of calculating said coordinate positions of said plurality of areas on said substrate by performing statistic calculation with said plurality of coordinate positions determined in the fifth step.

12. A method according to claim 10, wherein the sixth step includes:
weighting said determined coordinate positions to be used in the calculation for obtaining coordinate positions of each of said plurality of areas on the substrate.

13. A method of aligning each of a plurality of areas on a substrate and a predetermined position in a static coordinate system for defining a moving position of said substrate, comprising:

the first step of selecting several areas from said plurality of areas as specific areas and measuring respective coordinate positions of said several specific areas on said static coordinate system;

the second step of obtaining respective nonlinear position errors of said several specific areas on said static coordinate system based on said measured coordinate positions;

the third step of specifying, as an alternative area, at least one area of several areas around a peculiar specific area where said nonlinear error exceeds a predetermined value and obtaining a coordinate position of said alternative area on said static coordinate system;

the fourth step of obtaining a nonlinear position error of said at least one alternative area based on said coordinate position obtained in the third step;

the fifth step of determining, prior to calculating respective coordinate positions of said plurality of areas on said substrate by the use of said coordinate positions of said specific areas, a plurality of coordinate positions to be used in said calculation among said measured coordinate positions by comparing the nonlinear position error of said alternative area obtained in said fourth step with said predetermined value; and the sixth step of aligning each of the plurality of areas on said substrate with said predetermined position based on the determined coordinate positions.

14. A method according to claim 13, wherein the sixth step includes:
weighting said determined coordinate positions to be used in the calculation for obtaining coordinate positions of each of said plurality of areas on the substrate.

15. A method of obtaining alignment data, comprising:
the first step of selecting several areas from a plurality of areas on a substrate as sample areas and measuring respective position data of the selected areas;

the second step of specifying an area among the selected areas based on the measured position data of the selected areas;

the third step of measuring position data of at least one area around the specified area; and the fourth step of determining whether the measured position data of the specified area is used in a calculation for obtaining position data of each of the areas on said substrate in accordance with the position data obtained in said third step.

16. A method according to claim 15, wherein said fourth step includes:
checking a correlation degree between the position error of the specified area and the position error of an area around the specified area based on the position data measured in said first and third steps; and determining whether the measured position data of the specified area should be used for a calculation for obtaining position data of each of the areas on said substrate based on said correlation degree.

17. A method according to claim 15, wherein said fourth step comprises:

weighting respective coordinate positions of a plurality of areas which are determined, among the measured coordinate positions, to be used in the calculation for obtaining position data of each of the areas on the substrate.

* * * * *